(12) United States Patent
Yokoyama et al.

(10) Patent No.: US 7,341,634 B2
(45) Date of Patent: Mar. 11, 2008

(54) APPARATUS FOR AND METHOD OF PROCESSING SUBSTRATE

(75) Inventors: Toshio Yokoyama, Tokyo (JP); Masahiko Sekimoto, Tokyo (JP); Akira Ogata, Tokyo (JP); Hiroaki Inoue, Tokyo (JP); Seiji Katsuoka, Tokyo (JP)

(73) Assignee: Ebara Corporation, Tokyo (JP)

( * ) Notice: Subject to any disclaimer, the term of this patent is extended or adjusted under 35 U.S.C. 154(b) by 587 days.

(21) Appl. No.: 10/647,457

(22) Filed: Aug. 26, 2003

(65) Prior Publication Data

US 2004/0045502 A1     Mar. 11, 2004

(30) Foreign Application Priority Data

Aug. 27, 2002  (JP) ............................. 2002-247715
Sep. 30, 2002  (JP) ............................. 2002-286563

(51) Int. Cl.
*B05C 11/00*     (2006.01)
(52) U.S. Cl. ...................... 118/667; 118/429
(58) Field of Classification Search .................. 205/99, 205/101; 204/232, 237, 239, 241; 137/256, 137/263, 255; 366/177.1, 144, 145, 155.1, 366/117, 165.1, 160.1, 182.1–183.4, 152.1, 366/162.1; 118/666–667, 429, 602, 612, 118/613, 503
See application file for complete search history.

(56) References Cited

U.S. PATENT DOCUMENTS

| | | | | |
|---|---|---|---|---|
| 2,100,671 A | * | 11/1937 | Reavell | 237/63 |
| 2,509,288 A | * | 5/1950 | Brochner | 366/160.2 |
| 3,949,970 A | * | 4/1976 | ter Braak | 366/339 |
| 4,074,733 A | * | 2/1978 | Gray et al. | 141/32 |
| 4,406,250 A | * | 9/1983 | Araki et al. | 118/690 |
| 4,614,439 A | * | 9/1986 | Brunt et al. | 366/154.2 |
| 4,660,542 A | * | 4/1987 | Scherer | 126/378.1 |
| 4,761,077 A | * | 8/1988 | Werner | 366/165.1 |
| 4,856,456 A | * | 8/1989 | Hillman et al. | 118/500 |
| 5,217,536 A | * | 6/1993 | Matsumura et al. | 118/602 |
| 5,785,423 A | * | 7/1998 | Chikami | 366/165.3 |
| 5,938,845 A | * | 8/1999 | Ang | 118/429 |
| 6,042,712 A | * | 3/2000 | Mathieu | 205/209 |
| 6,120,175 A | * | 9/2000 | Tewell | 366/140 |
| 6,398,904 B1 | * | 6/2002 | Heo et al. | 156/345.11 |
| 6,638,564 B2 | * | 10/2003 | Segawa et al. | 427/8 |

* cited by examiner

*Primary Examiner*—Brenda A. Lamb
(74) *Attorney, Agent, or Firm*—Wenderoth, Lind & Ponack, L.L.P.

(57) ABSTRACT

A workpiece is processed uniformly, e.g., a uniform plated film is formed on a workpiece, by a processing liquid, e.g., a plating solution, which is maintained in an optimum state while minimizing the amount of the processing liquid to be used. An apparatus for processing the workpiece has a plurality of solution supply tanks 50a, 50b for individually holding a plurality of solutions, respectively, to be mixed into a processing liquid 54 while managing the temperatures of the solutions, a plurality of mixing tanks 52a, 52b for mixing the solutions individually supplied from the solution supply tanks 50a, 50b into the processing liquid 54 while managing the temperatures of the solutions, and a processing bath 56 for introducing the processing liquid 54 therein and processing the workpiece, e.g., a substrate W, by bringing the workpiece into contact with the processing liquid 54 while managing the temperature of the processing liquid 54.

10 Claims, 17 Drawing Sheets

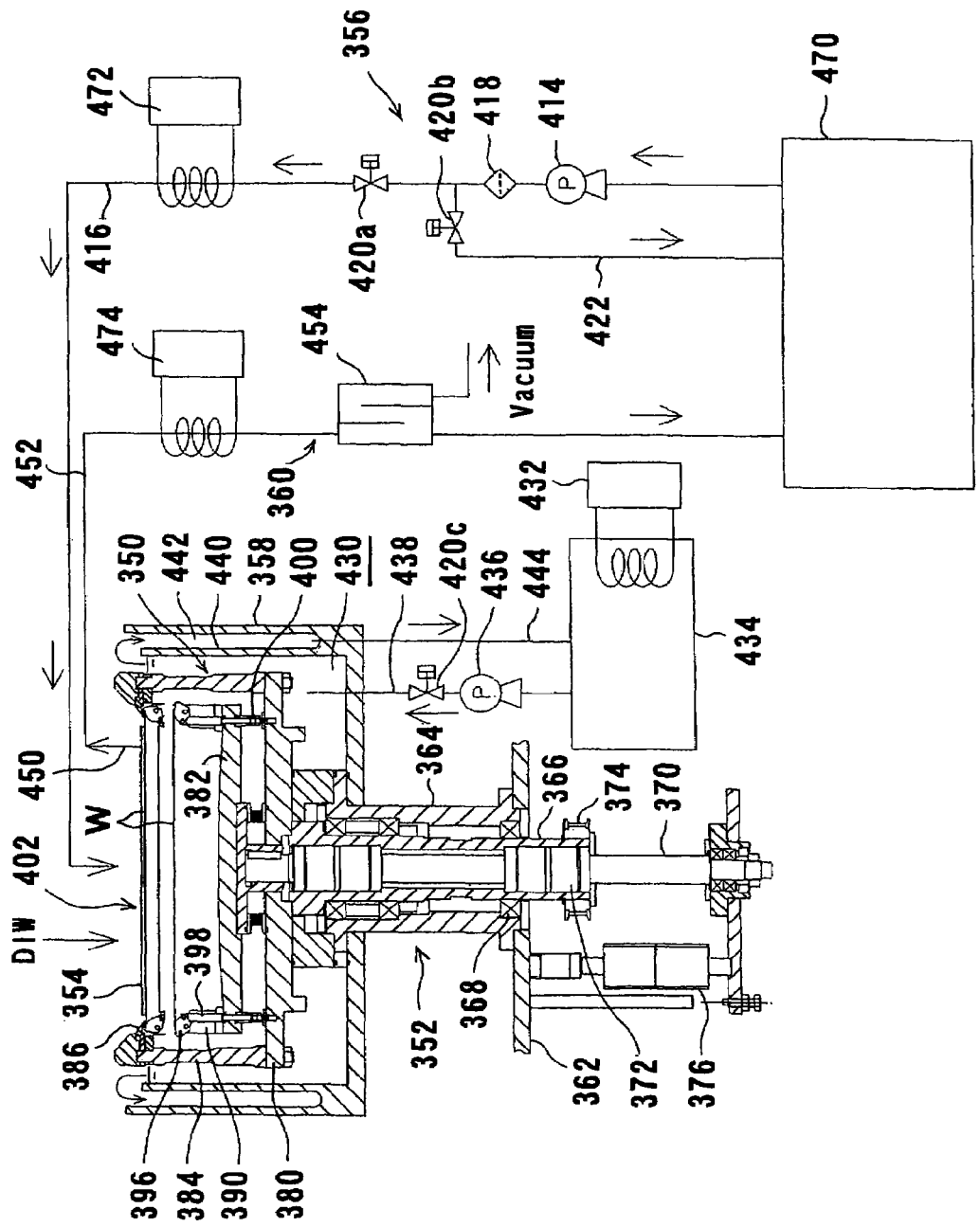

APPARATUS FOR AND METHOD OF PROCESSING SUBSTRATE

BACKGROUND OF THE INVENTION

1. Field of the Invention

The present invention relates to an apparatus for and a method of processing a substrate, and more particularly to an apparatus for and a method of processing a substrate, such as a semiconductor wafer or the like, to embed an electric conductor, such as copper, silver, gold, or the like, in fine interconnection recesses defined in a surface of the substrate for thereby forming embedded interconnects on the substrate.

The present invention also relates to an apparatus for and a method of processing a substrate with a processing liquid, such as an electroless plating solution or the like, which is produced and used to form an interconnects-protective layer for protecting surfaces of embedded interconnects that are formed in the manner described above.

Furthermore, the present invention is concerned with a substrate processing apparatus for use as an electroless plating apparatus for forming a protective layer for protecting surfaces of embedded interconnects that are formed in the manner described above.

2. Description of the Related Art

As a process for forming interconnects in a semiconductor device, a so-called "damascene process", which comprises embedding a metal (electric conductor) into trenches for interconnects and contact holes, is coming into practical use. According to this process, aluminum, or more recently, a metal such as copper or silver, is embedded into trenches for interconnects and contact holes previously formed in an interlayer dielectric film of a semiconductor substrate. Thereafter, an extra metal is removed by chemical mechanical polishing (CMP) so as to flatten a surface of the substrate.

In a case of interconnects formed by such a process, for example copper interconnects formed by using copper as an interconnect material, embedded copper interconnects have exposed surfaces after flattening processing. In order to prevent thermal diffusion of such interconnects (copper), or to prevent oxidation of such interconnects (copper) e.g. in forming thereon an insulating film (oxide film) under an oxidizing atmosphere to produce a semiconductor device having a multi-layer interconnects structure, it is now under study to selectively cover exposed surfaces of interconnects with an interconnects-protective layer (cap material) composed of a Co alloy, a Ni alloy or the like so as to prevent thermal diffusion and oxidation of the interconnects. Such an interconnects-protective layer of a Co alloy, a Ni alloy or the like can be produced e.g. by performing electroless plating.

As shown in FIG. 22, fine recesses (trenches) 4 are formed in an insulating film 2 Of $SiO_2$ or the like which has been deposited on a surface of a substrate W such as a semiconductor wafer. A barrier layer 6 of TaN or the like is formed on the entire surface of the substrate, and then copper plating, for example, is performed onto the surface of the substrate W to fill the fine recesses 4 with copper and deposit a copper film on the insulating film 2. Thereafter, CMP (chemical mechanical polishing) is performed onto the surface of the substrate W so as to flatten a surface of the substrate, thereby forming interconnects 8 composed of a copper film in the insulating film 2. Thereafter, an interconnects-protective layer (cap material) 9 composed of a Ni—B alloy film is formed e.g. by performing electroless plating selectively on surfaces of interconnects (copper film) 8 to protect interconnects 8.

The interconnects-protective layer 9 composed of the Ni—B alloy layer can be formed on surfaces of e.g. copper selectively by using an electroless plating solution which contains nickel ions, a completing agent for nickel ions, and an alkylamine borane or a borohydride compound as a reducing agent for nickel ions, and by immersing a surface of the substrate in the electroless plating solution.

An electroless plating is applied to main filling materials (Cu) for copper interconnects, the formation of a seed layer on a barrier metal, or the reinforcement of a seed (Cu), further the formation of a barrier metal itself, or the formation of an interconnects-protective layer (cap material) for copper interconnects (in any case, Ni—P, Ni—B, Co—P, Ni—W—P, Ni—Co—P, Co—W—P, Co—W—B), or the like. In any electroless plating process, uniformity of the film thickness over an entire surface of the substrate is required.

Generally, electroless plating apparatus of the face-up type employs a small amount of plating solution in one plating cycle, and find it difficult to manage the temperature of the plating solution, in particular, during the plating process. Specifically, the temperature of the plating solution, i.e., the plating temperature, is an important parameter for the processing of substrates, and should preferably be kept at an appropriate level at all times during the plating process. However, as the amount of plating solution used is smaller, the temperature of the plating solution becomes lower during the plating process. The reduction in the temperature of the plating solution greatly affects the plating process, tending to cause variations in the thickness of the plated film. Furthermore, it has been customary for the electroless plating apparatus of the face-up type to operate in one pass, i.e., throw away the plating solution that has been used to plate workpieces in one plating cycle. The one-pass operation, however, is liable to consume a large amount of plating solution, and incur a high running cost.

One solution is to use a circulation process for retrieving and circulating a plating solution for reuse. A retrieving and circulating system, which is based on the circulation process, generally has a circulation tank for storing and circulating a plating solution. The retrieving and circulating system operates by supplying a certain amount of plating solution which has been heated to a given temperature in the circulation tank to a surface, to be plated, of a workpiece thereby to plate a surface of the workpiece, retrieving the plating solution that is left on a plated surface of the workpiece, and returning the retrieved plating solution to the circulation tank.

The electroless plating solution is a mixture of several solutions depending on the electroless plating process, and generally comprises a basic liquid to which a reducing agent, e.g., sodium hypophosphite, is added. For the fabrication of semiconductor devices, it is desirable to use a plating solution to which a sodium-free reducing agent is added for preventing the semiconductor devices from being contaminated by alkali metal. However, a plating solution containing a sodium-free reducing agent is generally unstable and can easily be decomposed, and can more easily be decomposed when kept at a high temperature. When the plating solution is heated to a high temperature in the circulation tank, the plating solution in the circulation tank is easily decomposed, and hence the plating solution stored in the circulation tank, which generally has a large volume, is consumed in a large quantity. If the plating solution, which is retrieved from plated workpieces, is returned in a batch to the circulation tank, then the temperature of the plating solution in the circulation tank is changed, causing variations in the thickness of the plated film.

In the electroless plating process, therefore, the temperature of the plating solution is an important factor for the processing of substrates to be plated, and the amount of plating solution to be used should preferably be held to a minimum required. Once the electroless plating solution, which is a mixture of several solutions depending on the electroless plating process, is produced, the plating solution is highly activated at temperatures higher than a certain temperature, tending to adversely affect the plating process. Consequently, it is desirable to mix a plurality of solutions efficiently into a plating solution immediately before the plating solution is used to plate workpieces.

Rather than the process of heating the plating solution in the circulation tank, an in-line heating process may be employed to heat a necessary amount of plating solution while the plating solution is being supplied, for thereby preventing an increase in the consumption of the plating solution due to its decomposition at high temperatures. However, the in-line heating process generally makes it difficult to manage the temperature of the plating solution, and needs a heating device, such as a considerably large heater or the like, resulting in a large plating facility. If a small heating device such as a heater is employed, then it is necessary to increase the difference between the temperature of the surface of a heat source and the temperature of the plating solution. When the difference between the temperature of the surface of the heat source and the temperature of the plating solution is increased, not only substances are liable to be formed on the surface of the heat source, but also the plating solution tends to be overheated and decomposed locally on the surface of the heat source.

SUMMARY OF THE INVENTION

The present invention has been made in view of the above drawbacks in the related art. It is therefore a first object of the present invention to provide an apparatus for and a method of processing a substrate with a processing liquid, such as a plating solution, which is kept in an optimum state at all times while minimizing the amount of processing liquid being used, to uniformly process the substrate, e.g., to form a uniform plated film on the substrate.

It is a second object of the present invention to provide an apparatus for and a method of processing a substrate with a processing liquid, such as an electroless plating solution, which is kept in an optimum state at all times while minimizing the amount of processing liquid being used, to form a uniform plated film on the substrate.

In order to achieve the above objects, there is provided in accordance with the present invention an apparatus for processing a substrate, comprising a plurality of solution supply tanks for individually holding a plurality of solutions, respectively, to be mixed into a processing liquid, the solution supply tanks having respective temperature regulators, a mixing tank connected to the solution supply tanks for mixing the solutions supplied respectively from the solution supply tanks into the processing liquid, the mixing tank having a temperature regulator, and a processing bath connected to the mixing tank for processing the substrate by bringing the substrate into contact with the processing liquid which is introduced from the mixing tank into the processing bath.

Before the solutions are mixed into the processing liquid, such as an electroless plating, which can easily react and is unstable at high temperatures, the solutions which can stably be stored at high temperatures are preheated, and the preheated solutions are mixed in the mixing tanks to produce the processing liquid at a predetermined temperature. Even if the amount of the processing liquid is small, the processing liquid is stabilized in temperature and can quickly be supplied to the processing bath.

According to a preferred aspect of the present invention, the apparatus further comprises a heat-insulating unit for keeping the processing liquid in the processing bath at a predetermined temperature. By thus managing the temperature of the processing liquid in the processing bath, the temperature of the processing liquid is prevented from being lowered with time especially when the processing liquid is used in a small amount.

Each of the solution supply tanks may have metering device for supplying the solutions in amounts required to produce the processing liquid to the mixing tank. When the solutions in given amounts required to produce the processing liquid, such as a plating solution, are supplied through the metering device to the mixing tank and mixed in the mixing tank, the processing liquid can be produced in a short period of time.

Another apparatus for processing a substrate according to the present invention comprises a plurality of solution supply tanks for individually holding a plurality of solutions, respectively, to be mixed into a processing liquid, a plurality of mixing tanks connected to the solution supply tanks for mixing the solutions supplied respectively from the solution supply tanks into the processing liquid, a processing bath connected to the mixing tanks through respective processing liquid supply passages for processing the substrate by bringing the substrate into contact with the processing liquid which is introduced from the mixing tanks into the processing bath, a plurality of stop valves disposed in the processing liquid supply passages, respectively, and a controller for controlling the stop valves to selectively open and close the processing liquid supply passages.

If contaminants find their way into one of the mixing tanks which produce the processing liquid, e.g., an electroless plating solution, that is generally unstable and tends to be decomposed, impairing the quality of the processing liquid to the extent that the processing liquid will no longer be used, then only the processing liquid produced in that mixing tank may be discarded. Therefore, the amount of the processing liquid to be discarded is relatively small. The processing liquid produced in the other mixing tanks may be used to continuously process the substrate.

According to a preferred aspect of the present invention, the solution supply tanks have respective temperature regulators and the mixing tanks have respective temperature regulators, the apparatus further comprising a heat-insulating unit for keeping the processing liquid in the processing bath at a predetermined temperature.

The controller should preferably control the stop valves such that while the processing liquid produced in one of the mixing tanks is being supplied to the processing bath, another one of the mixing tanks is prepared to supply the processing liquid to the processing bath. With this arrangement, it is possible to eliminate a time lag or delay which would otherwise occur when switching the connection between the mixing tanks and the processing bath to supply a new processing liquid to the processing bath.

The mixing tanks should preferably have respective stirrers for stirring and mixing the solutions supplied to the mixing tanks. When the solutions supplied to each of the mixing tanks are stirred by the stirrer and mixed into the processing liquid, the temperature of the processing liquid is made more uniform than if no stirrer were employed.

Still another apparatus for processing a substrate according to the present invention comprises a plurality of solution supply tanks for individually holding a plurality of solutions, respectively, to be mixed into a processing liquid, the solution supply tanks having respective temperature regulators, a processing bath connected to the solution supply tanks for processing the substrate by bringing the substrate into contact with the processing liquid which is produced by mixing the solutions supplied respectively from the solution supply tanks, a heat-insulating unit for keeping the processing liquid in the processing bath at a predetermined temperature, and metering device for supplying the solutions in amounts required to produce the processing liquid to the processing bath.

Before the solutions are mixed into the processing liquid, such as a plating solution, which can easily react and is unstable at high temperatures, the solutions which can stably be stored at high temperatures are preheated, and the preheated solutions are mixed in the mixing tanks to produce the processing liquid at a predetermined temperature. Even if the amount of the processing liquid is small, the processing liquid, which is stable in temperature, can be produced in the processing bath and can be used to process the substrate in the processing bath. By managing the temperature of the processing liquid in the processing bath, the temperature of the processing liquid is prevented from being lowered with time especially when the small amount of the processing liquid is used.

The processing bath may be arranged to introduce the solutions supplied from the solution supply tanks, tangentially into the processing bath thereby to mix the introduced solutions into the processing liquid. With this arrangement, the solutions can be mixed by the effective utilization of a kinetic energy that the solutions introduced into the processing bath have.

The processing bath should preferably have a stirrer for stirring the processing liquid introduced into the processing bath. When the processing liquid in the processing bath is stirred with the stirrer, the temperature of the processing liquid is made more uniform than if the stirrer were not employed.

Yet another apparatus for processing a substrate according to the present invention comprises a processing bath for processing the substrate by bringing the substrate into contact with a processing liquid which is produced by mixing a plurality of solutions, and a heat-insulating tank for holding the processing liquid in the processing bath at a predetermined temperature with a thermal medium comprising a liquid.

Even if the processing bath holds the processing liquid in a small amount, the processing liquid in the processing bath can reliably be heated and kept in temperature by submerging the overall processing liquid in the processing bath in the thermal medium such as hot water. By giving a sufficient heat capacity to the thermal medium such as hot water stored in the heat-insulating tank, it is possible to perform an efficient heat exchange between the processing liquid in the processing bath and the thermal medium in the heat-insulating tank.

According to a preferred aspect of the present invention, the apparatus further comprises a heated liquid supply tank for storing and heating the liquid as the thermal medium, the heat-insulating tank and the heated liquid supply tank being connected to each other for circulating the heated liquid as the thermal medium therebetween. With this arrangement, the thermal medium, such as hot water, which is held at a substantially constant temperature is circulated through the heat-insulating tank to uniformly heat the processing liquid in the processing bath.

According to the present invention, there is also provided a method of processing a substrate with an apparatus having a plurality of mixing tanks for individually introducing therein a plurality of solutions and mixing the solutions into a processing liquid, and a processing bath connected to the mixing tanks for processing the substrate by bringing the substrate into contact with the processing liquid which is introduced from the mixing tanks into the processing bath, the method comprising introducing the processing liquid from one of the mixing tanks into the processing bath, and switching the connection between the mixing tanks and the processing bath to introduce the processing liquid from another one of the mixing tanks into the processing bath depending on a state of the processing liquid in the one of the mixing tanks.

According to a preferred aspect of the present invention, the connection between the mixing tanks and the processing bath is switched either when the amount of the processing liquid in the mixing tank which is introducing the processing liquid into the processing bath has reached a predetermined level, or when the processing liquid in the mixing tank which is introducing the processing liquid into the processing bath has processed a predetermined number of substrates.

Still yet another apparatus for processing a substrate according to the present invention comprises a processing head for processing the substrate by bringing the substrate into contact with a processing liquid supplied to and held in the processing head, the processing head having a substrate holder for holding the substrate, a heat-insulating tank surrounding the substrate holder in a water-tight manner, for holding the processing liquid held in the processing head together with the substrate holder at a predetermined temperature with a thermal medium, and a processing liquid supplying system for supplying the processing liquid at a predetermined temperature to the processing head.

Even if the processing liquid is supplied in a small amount to the processing head and held in the processing head, since the substrate holder which is holding the substrate is surrounded by the heat-insulating tank in a water-tight manner and the temperature of the substrate together with the substrate holder is managed by the thermal medium to keep the temperature of the processing liquid held in the processing head at a predetermined level, the processing liquid is prevented from changing while the substrate is being processed by the processing liquid.

According to a preferred aspect of the present invention, the apparatus further comprises a processing liquid retrieving system for retrieving the processing liquid which has been used to process the substrate from the processing head and returning the retrieved processing liquid to the processing liquid supplying system.

Thus, the amount of the processing liquid to be used is minimized by retrieving the processing liquid which has been used to process the substrate for reuse.

Preferably, the processing head is arranged to hold the substrate with the substrate holder while a surface to be processed of the substrate is facing upwardly, and to define a processing bath for holding the processing liquid with the surface to be processed of the substrate and a seal ring for sealing an outer peripheral region of the surface to be processed of the substrate.

With the above arrangement, it is possible to process the substrate according to a face-up plating process which allows air bubbles to be removed well and generally uses a small amount of plating solution in one plating cycle.

According to a preferred aspect of the present invention, the apparatus further comprises a hot water supply tank for holding a liquid as the thermal medium, the hot water supply tank having a temperature regulator, the heat-insulating tank and the hot water supply tank being connected to each other for circulating the thermal medium therebetween.

The thermal medium, such as hot water, which has a sufficient heat capacity and is held at a substantially constant temperature, is circulated through the heat-insulating tank to keep at a constant temperature the processing liquid supplied to and held in the substrate holder and the processing head that are surrounded by the heat-insulating tank.

According to a preferred aspect of the present invention, the apparatus further comprises a heating head for contacting the processing liquid held in the processing head thereby to heat the processing liquid.

By heating the processing liquid, such as an electroless plating solution, supplied to and held in the processing head, directly with the heating head, the processing liquid is prevented from having different temperatures at positions over the central and peripheral regions of the substrate held by the substrate holder.

The heating head should preferably have a contact surface for contacting the processing liquid held in the processing head, the contact surface being tapered such that the distance between the contact surface and the surface of the processing liquid held in the processing head is progressively increased radially outwardly from the center of the contact surface.

With the above arrangement, when the heating head contacts the processing liquid, the region of the heating head that contacts the processing liquid is progressively spread uniformly from the central region toward the outer circumferential region of the heating head, preventing air pockets from being developed in the interface between the heating head and the processing liquid.

Preferably, the processing liquid supplying system has a processing liquid supply tank for holding the processing liquid therein, the processing liquid supply tank having a temperature regulator and a stirrer for stirring the processing liquid held therein.

With the above arrangement, the processing liquid (plating solution) in the processing liquid supplying system can be kept at a constant temperature and continuously be supplied to the processing head.

The processing liquid supplying system should preferably have a processing liquid supply tank for holding the processing liquid therein, and a temperature regulating device for regulating the temperature of the processing liquid which is supplied from the processing liquid supply tank to the processing head.

The temperature regulating device may comprise a heater for heating the processing liquid in a desired amount with the heater while the processing liquid is being supplied. Therefore, the consumption of the processing liquid such as an electroless plating solution is prevented from increasing due to the decomposition thereof at high temperatures.

Preferably, the processing liquid retrieving system has a temperature regulating device for regulating the temperature of the processing liquid which is returned from the processing head to the processing liquid supplying system.

The temperature regulating device may comprise a cooler for cooling the processing liquid which has been used to process the substrate into a mild and inactive state, so that the cooled processing liquid may be retrieved to the processing liquid supplying system. Alternatively, the temperature regulating device may comprise a heater for heating the processing liquid which has been used to process the substrate, so that the processing liquid kept at a certain temperature may be retrieved to the processing liquid supplying system.

According to a preferred aspect of the present invention, the processing liquid supplying system has a plurality of solution supply tanks for individually holding a plurality of solutions, respectively, to be mixed into a processing liquid, the solution supply tanks having respective temperature regulators, and a plurality of mixing tanks connected to the solution supply tanks for mixing the solutions supplied respectively from the solution supply tanks into the processing liquid, the mixing tanks having respective temperature regulators.

With the above arrangement, before the solutions are mixed into the processing liquid, such as an electroless plating solution, which can easily react and is unstable at high temperatures, the solutions which can stably be stored at high temperatures are preheated, and the preheated solutions are mixed in the mixing tanks to produce the processing liquid at a predetermined temperature. Even if the amount of the processing liquid is small, the temperature of the processing liquid can be stabilized, and the processing liquid is stabilized in temperature and can quickly be supplied to the processing head.

According to a preferred aspect of the present invention, the processing liquid supplying system has a plurality of solution supply tanks for individually holding a plurality of solutions, respectively, to be mixed into a processing liquid, and a plurality of mixing tanks connected to the solution supply tanks for mixing the solutions supplied respectively from the solution supply tanks into the processing liquid.

With the above arrangement, if contaminants find their way into one of the mixing tanks which produce the processing liquid, e.g., an electroless plating solution, that is generally unstable and tends to be decomposed, impairing the quality of the processing liquid to the extent that the processing liquid will no longer be used, then only the processing liquid produced in that mixing tank may be discarded. Therefore, the amount of the processing liquid to be discarded is relatively small. The processing liquid produced in the other mixing tanks may be used to continuously process the substrate.

The above and other objects, features, and advantages of the present invention will become apparent from the following description when taken in conjunction with the accompanying drawings, which illustrate preferred embodiments of the present invention by way of example.

BRIEF DESCRIPTION OF THE DRAWINGS

FIG. 17 is a schematic view of another electroless plating section;

DETAILED DESCRIPTION OF THE PREFERRED EMBODIMENTS

Figure 1:
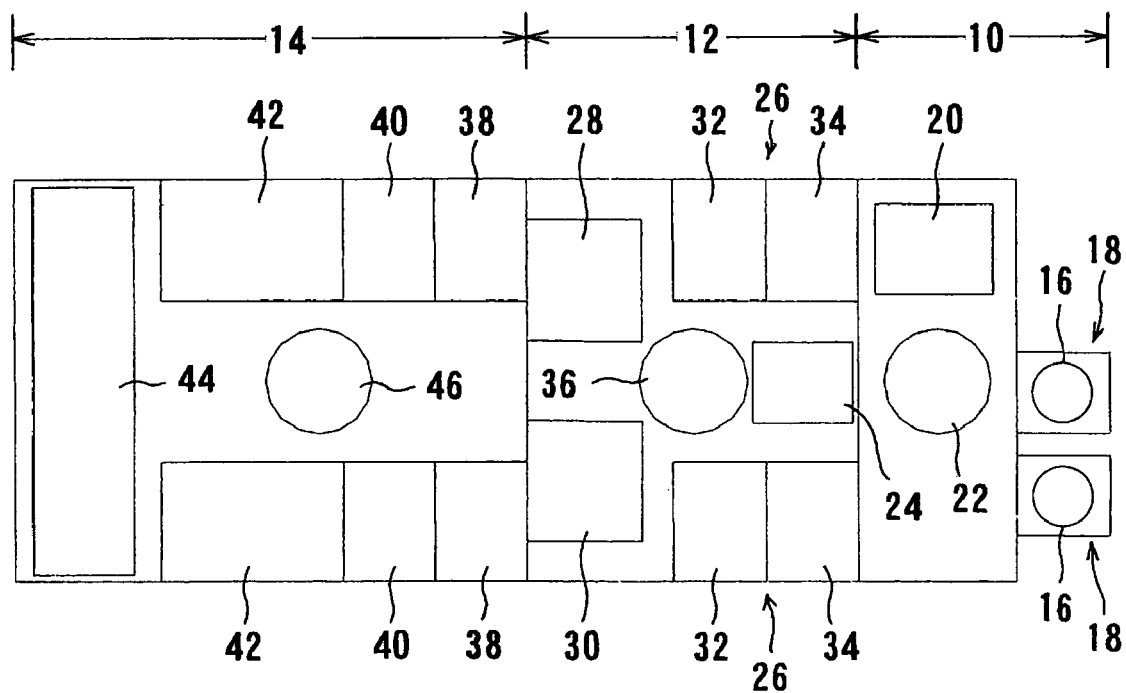
FIG. 1 is a plan view of a substrate processing apparatus as applied to an electroless plating apparatus according to an embodiment of the present invention.

Preferred embodiments of the present invention, which are applied to electroless plating apparatus for efficiently forming an interconnects-protective layer on surfaces of interconnects on a substrate by performing electroless plating, will be described below. The present invention is also applicable to other substrate processing apparatus including an electroplating apparatus, a CVD apparatus, or the like. Like or corresponding parts are denoted by like or corresponding reference characters throughout views.

FIG. 1 shows the layout, as viewed in plan, of a substrate processing apparatus (electroless plating apparatus) according to an embodiment of the present invention. As shown in FIG. 1, the layout of the substrate processing apparatus as viewed in plan is divided into three areas, i.e., a loading/unloading area 10, a cleaning area 12, and a plating area 14. The substrate processing apparatus (electroless plating apparatus) is installed in a clean room. The pressures in the areas are selected such that the pressure in the loading/unloading area 10 is higher than the pressure in the cleaning area 12, and the pressure in the cleaning area 12 is higher than the pressure in the plating area 14. The pressure in the loading/unloading area 10 is lower than the pressure in the clean room. With such pressure settings, air does not flow from the plating area 14 into the cleaning area 12, air does not flow from the cleaning area 12 into the loading/unloading area 10, and air does not flow from the loading/unloading area 10 into the clean room.

The loading/unloading area 10 accommodates therein two loading/unloading units 18 for placing therein respective substrate cassettes 16 each housing substrates W (see FIG. 22) each of which has interconnects 8 disposed in interconnection recesses (trenches) 4 defined in the surface of the substrate W, a first turning device 20 for turning a substrate W through 180°, and a first transfer robot 22 for transferring a substrate W between the substrate cassettes 16, the first turning device 20 and a below-described temporary support table 24.

The cleaning area 12 accommodates therein a temporary support table 24 positioned near the loading/unloading area 10, two cleaning units 26 positioned one on each side of the temporary support table 24 for cleaning a plated substrate W, a pre-cleaning unit 28 positioned near the plating area 14 for cleaning a substrate W before it is plated, and a second turning device 30 for turning a substrate W through 180°. Each of the cleaning units 26 comprises a roll brush unit 32 and a spin dry unit 34. The roll brush unit 32 cleans a plated substrate W in two stages, i.e., scrubs the substrate W and cleans the substrate W with a chemical liquid. The spin dry unit 34 spins a plated substrate W to dry the plated substrate W under centrifugal forces. The cleaning area 12 also has a second transfer robot 36 positioned in a region surrounded by the temporary support table 24, the two cleaning units 26, the pre-cleaning unit 28, and the second turning device 30, for transferring a substrate W between these table and units.

The plating area 14 accommodates therein two first preprocessing units 38 each for applying a catalyst to a surface to be processed of a substrate W, two second preprocessing units 40 each for processing with a chemical liquid the surface of the substrate W to which the catalyst is applied, and two electroless plating units 42 each for performing electroless plating on the surface of the substrate W. The plating area 14 also has a plating solution supplying device 44 disposed at an end thereof, and a third transfer robot 46 movably disposed in a region surrounded by these units and device for transferring a substrate W between the pre-cleaning unit 28, the first preprocessing units 38, the second preprocessing units 40, the electroless plating units 42, and the second turning device 30.

Figure 22:
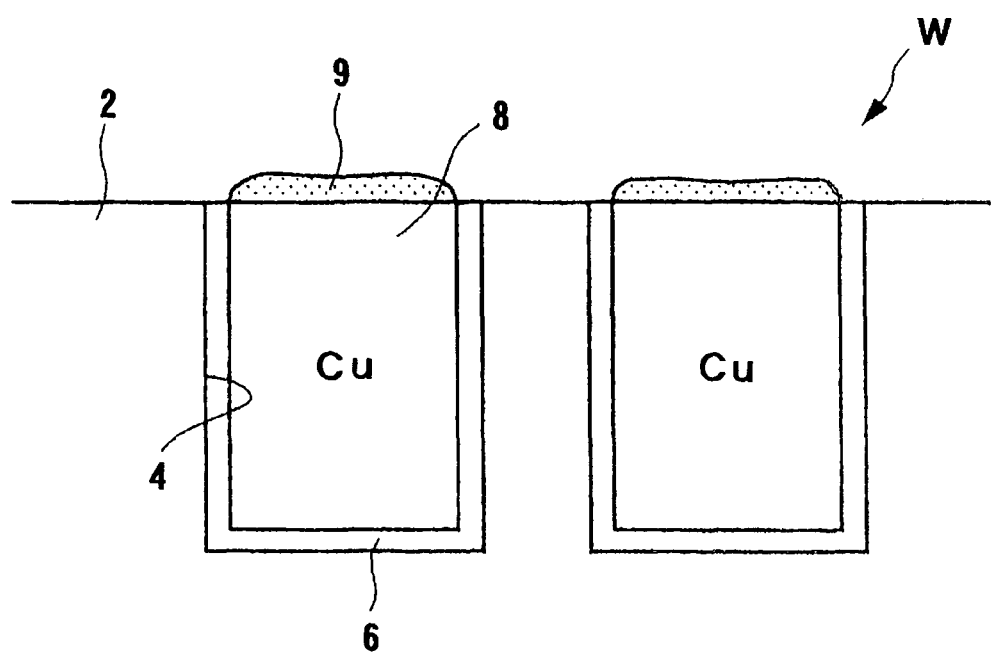
FIG. 22 is an enlarged fragmentary cross-sectional view of a substrate with an interconnects-protective layer formed by performing electroless plating.

An electroless plating process performed by the electroless plating apparatus shown in FIG. 1 will be described below. In the electroless plating process to be described below, as shown in FIG. 22, an interconnects-protective layer (cap material) 9 made of a Ni—B alloy film is selectively formed to protect respective interconnects 8.

Substrates W (see FIG. 22) with interconnects 8 formed on their surfaces are placed in each of the substrate cassettes 16, and the substrate cassettes 16 are accommodated in the respective loading/unloading units 18. In the substrate cassettes 16, the surfaces to be processed of the substrates W face upwardly (face up). The first transfer robot 22 takes up one of the substrates W from one of the substrate cassettes 16, and transfers the substrate W to the first turning device 20. The first turning device 20 turns the substrate W through 180° until the surface thereof to be processed faces downwardly (face down). The turned substrate W is then placed on the temporary support table 24. The substrate W is then transferred from the temporary support table 24 to the pre-cleaning unit 28 by the second transfer robot 36.

The pre-cleaning unit 28 holds the substrate W with a surface facing downward, and pre-cleans the surface of the substrate W. For example, in the pre-cleaning unit 28, the substrate W is dipped in an acid solution of e.g., 0.5 M of $H_2SO_4$ at a temperature of e.g., 25° C. for 1 minute, thereby to remove CMP (Chemical Mechanical Polishing) residuals of copper or the like from the surface of an insulating film 2 (see FIG. 22). Thereafter, the surface of the substrate W is cleaned with cleaning liquid such as ultrapure water.

Then, the third transfer robot 46 transfers the pre-cleaned substrate W to one of the first preprocessing units 38, which holds the substrate W with the surface facing downward, and applies a catalyst to the surface of the substrate W. For example, the substrate W is dipped in a mixed solution of e.g., 0.005 g/L of $PdCl_2$ and 0.2 ml/L of HCl at a temperature of e.g., 25° C. for 1 minute, thereby to apply a catalyst of Pb to surfaces of interconnects 8, i.e., form catalyst seeds, i.e., Pd seeds, to surfaces of interconnects 8, thus activating exposed surfaces of the interconnects 8. Thereafter, the surface of the substrate W is cleaned with cleaning liquid such as ultrapure water.

The third transfer robot 46 then transfers the substrate W with the catalyst applied thereto to one of the second preprocessing units 40, which holds the substrate W with the surface facing downward, and processes the surface of the substrate W with a chemical liquid. For example, the substrate W is dipped in a solution of e.g., 20 g/L of $Na_3C_6H_5O_7.2H_2O$ (sodium citrate) at a temperature of e.g., 25° C., thereby to neutralize surfaces of interconnects 8, after which the surface of the substrate W is cleaned with cleaning liquid such as ultrapure water.

Then, the third transfer robot 46 transfers the preprocessed substrate W to one of the electroless plating units 42, which holds the substrate W with the surface facing downward, and performs electroless plating on the surface of the substrate W. For example, the substrate W is dipped in an electroless Ni—B plating solution at a temperature of e.g., 70° C. for about 120 seconds, thereby to perform selective electroless plating (electroless Ni—B cap plating) on the activated surfaces of the substrate W. Thereafter, the surface of the substrate W is cleaned with cleaning liquid such as ultrapure water. In this manner, an interconnects-protective layer 9 (see FIG. 22) of a Ni—B alloy film is selectively formed on surfaces of interconnects 8 for protecting interconnects 8.

Then, the third transfer robot 46 transfers the plated substrate W to the second turning device 30, which turns the substrate W to face the surface of the substrate W upwardly (face up). The second transfer robot 36 transfers the turned substrate W to the roll brush unit 32 of one of the cleaning units 26. The roll brush unit 32 removes particles and other unwanted foreign matters from the surface of the substrate W with a roll brush. Thereafter, the second transfer robot 36 transfers the substrate W to the spin dry unit 34, which cleans the surface of the substrate W with a chemical solution and pure water, and then spins the substrate W to dry the same under centrifugal forces.

The dried substrate W is then placed on the temporary support table 24 by the second transfer robot 36. The substrate W placed on the temporary support table 24 is then returned with the first transfer robot 22 to the substrate cassette 16 accommodated in one of the loading/unloading units 18.

In the present embodiment, a Ni—B alloy is used as the material of the interconnects-protective layer 9. Specifically, the surface of the substrate W is dipped in an electroless plating solution which contains nickel ions, a complexing agent for nickel ions, alkylamine borane or hydrogen boride compound as a reducing agent for nickel ions, and a pH adjust agent such as tetramethylammonium hydroxide or aqueous ammonia, and whose pH has been adjusted to 8 to 12, for example, thus forming the interconnects-protective layer (Ni—B alloy layer) 9. The temperature of the plating solution is in a range from 50 to 90° C., preferably from 55 to 75° C., for example.

Alkylamine borane as the reducing agent may comprise dimethylamine borane (DMAB), diethylamine borane, or the like, for example. The complexing agent for nickel ions may comprise malic acid, glycine, or the like, for example. The hydrogen boride compound may comprise $NaBH_4$, for example.

While a Ni—B alloy is used as the material of the interconnects-protective layer 9 in the present embodiment, the interconnects-protective layer 9 may alternatively be made of Ni—P, Ni—W—B, Ni—W—P, Co—W—B, Co—W—P, Co—P, Co—B, or the like. While copper is used as the material of interconnects in the present embodiment, interconnects may alternatively be made of copper alloy, silver, silver alloy, gold, gold alloy, or the like.

Figure 2:
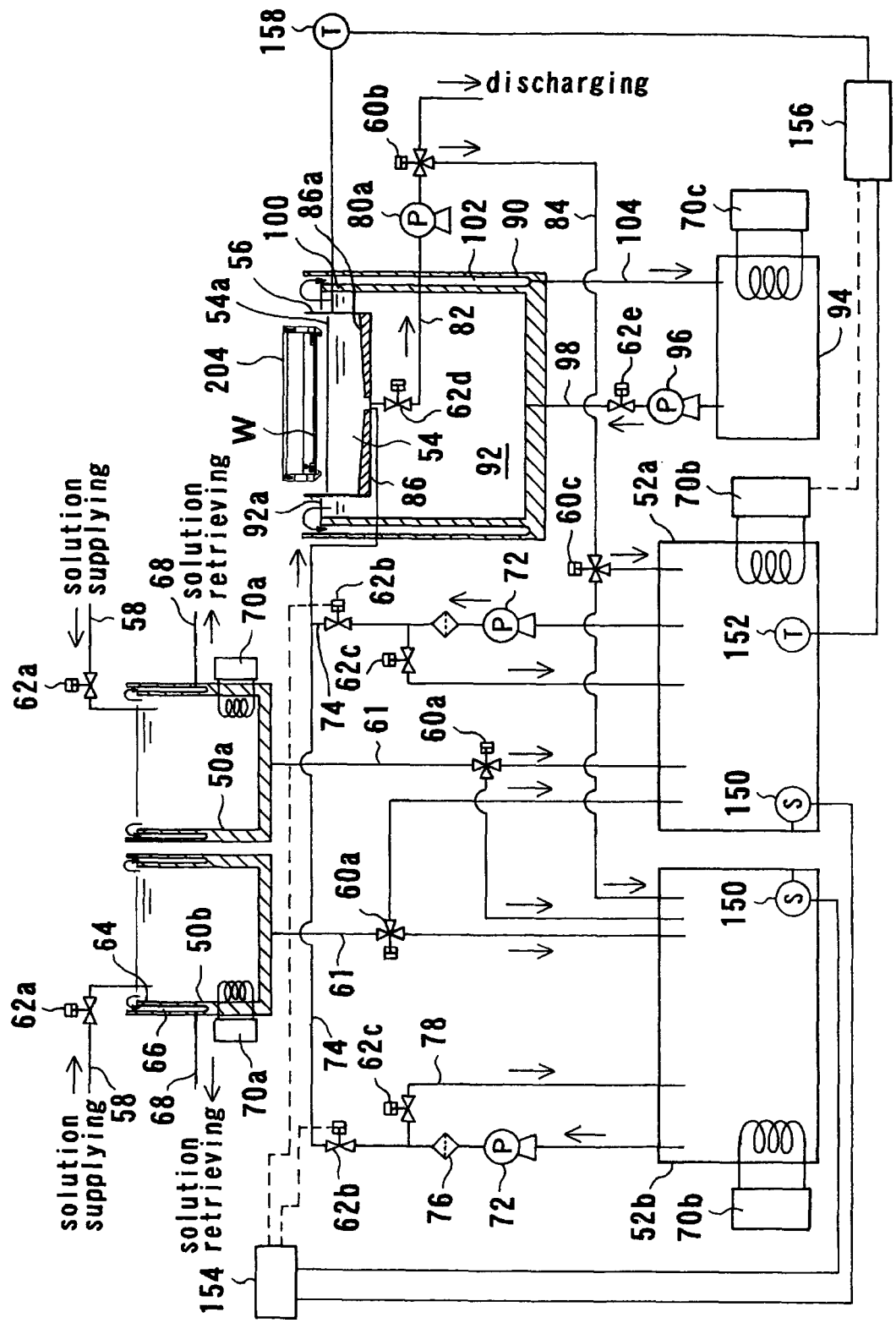
FIG. 2 is a schematic view of a system for producing and circulating a plating solution (processing liquid) in the electroless plating apparatus.

FIG. 2 schematically shows a system for producing and circulating an electroless plating solution (processing liquid) in the electroless plating apparatus.

As shown in FIG. 2, the system has two solution supply tanks 50a, 50b, in the present embodiment, for individually holding a plurality of solutions which are to be mixed into a plating solution, and two mixing tanks 52a, 52b, in the present embodiment, for mixing two solutions individually supplied from the two solution supply tanks 50a, 52b to produce a plating solution. Each of the above-described electroless plating units 42 comprises a processing head 204 for holding a substrate W with the surface to be processed facing downwardly, and a processing bath (plating bath) 56 for holding therein a plating solution 54 which has been produced by the mixing tanks 52a, 52b. The surface of the substrate W is plated when the surface of the substrate W, which is held by the processing head 204, is brought into contact with the plating solution 54 in the processing bath 56.

One of the solution supply tanks 50a holds a solution containing only a reducing agent for a plating solution component, e.g., dimethylamine borane (DMAB) or hydrogen boride compound as a reducing agent for nickel ions, if an electroless Ni—B plating solution is to be produced. The other solution supply tank 50b holds a solution containing other plating solution components, e.g., nickel ions, a complexing agent for nickel ions, TMAH (tetramethylammonium hydroxide), and other components, if an electroless Ni—B plating solution is to be produced.

The number of solution supply tanks used depends on the type of a processing liquid to be used to process a substrate, e.g., the type of an electroless plating solution to be used in an electroless plating process. Stated otherwise, there are employed as many solution supply tanks as necessary to keep solutions to be mixed into a processing liquid such as a plating solution in safe storage against reaction even when heated.

To the solution supply tanks 50a, 50b, there are connected respective solution supplies 58 such as house lines for individually supplying solutions to the solution supply tanks 50a, 50b, and respective solution supply passages 61 for drawing the solutions stored in the solution supply tanks 50*a*, 50*b* through their bottoms and supplying the solutions by gravity to a selected one of the mixing tanks 52*a*, 52*b* through respective three-way valves 60*a*. Each of the solution supplies 58 has a stop valve 62*a*. The solution supply tanks 50*a*, 50*b* are surrounded by respective overflow dams 64 of given height and respective retrieval grooves 66 for retrieving solutions that have overflowed the overflow dams 64 from the solution supply tanks 50*a*, 50*b*. The retrieval grooves 66 are connected to respective solution retrieval passages 68 for retrieving the overflowing solutions. The overflow dams 64, the retrieval grooves 66, and the retrieval passages 68 jointly make up a metering device for supplying the mixing tanks 52*a*, 52*b* with amounts of solutions that are required to produce a desired plating solution. Specifically, when solutions stored in the solution supply tanks 50*a*, 50*b* exceed a predetermined amount, the solutions overflow the overflow dams 64 into the retrieval grooves 66. Therefore, the solutions are held in the predetermined amount in the solution supply tanks 50*a*, 50*b*. The amount held in each of the solution supply tanks 50*a*, 50*b* is set to a necessary amount to produce a plating solution for each solution. The solution supply tanks 50*a*, 50*b* are combined with respective detecting means, such as level sensors or the like, for detecting when the solutions in the solution supply tanks 50*a*, 50*b* start overflowing into the retrieval grooves 66. In response to signals from the detecting means, the stop valves 62*a* are closed to stop supplying the solutions from the solution supplies 58 to the solution supply tanks 50*a*, 50*b*.

The solution supply tanks 50*a*, 50*b* are also combined with respective temperature regulators 70*a* having heaters for heating the solutions held in the solution supply tanks 50*a*, 50*b* to predetermined temperatures and keeping the solutions at the predetermined temperatures, respectively. If the system is to use an electroless Ni—B plating solution at a temperature of 70° C., then the solutions held in the solution supply tanks 50*a*, 50*b* are preheated to a temperature in a range from 50 to 60° C., for example, by the temperature regulators 70*a*, and the solutions thus preheated are supplied in given amounts to a selected one of the mixing tanks 52*a*, 52*b*.

The solutions held in the solution supply tanks 50*a*, 50*b* are solutions that can stably be stored even at increased temperatures before they are mixed into a plating solution, which is easily reactive and hence unstable at high temperatures. Therefore, the solutions held in the solution supply tanks 50*a*, 50*b* are prevented from reacting and being decomposed even when they are preheated prior to being mixed together.

In the present embodiment, the metering device for supplying a predetermined amount of solution from the solution supply tanks 50*a*, 50*b* to a selected one of the mixing tanks 52*a*, 52*b* includes the overflow dam 64. Alternatively, the metering device may comprise a pump or a measuring device, such as a load cell, an integrating flowmeter, or the like, for controlling the amount of solution to be supplied.

The mixing tanks 52*a*, 52*b*, as described above, serve to mix predetermined amounts of preheated solutions supplied from the solution supply tanks 50*a*, 50*b* into the plating solution 54. The mixing tanks 52*a*, 52*b* are combined with respective temperature regulators 70*b* having heaters for heating the plating solution 54 produced in the mixing tanks 52*a*, 52*b* to a predetermined temperature and keeping the plating solution 54 at the predetermined temperature, respectively. The plating solution 54 produced and heated to a predetermined temperature in the mixing tanks 52*a*, 52*b* is delivered by liquid delivery pumps 72 disposed respectively in processing liquid supply passages (plating solution supply passages) 74 through the processing liquid supply passages 74 to the processing bath (plating bath) 56, successively. Each of the processing liquid supply passages 74 has a filter 76 and a stop valve 62*b*, and is connected to the center of the bottom of the processing bath 56 for supplying the plating solution 54 into the processing bath 56 from its bottom.

In the present embodiment, the three-way valves 60*a* disposed in the solution supply passages 61 extending from the solution supply tanks 50*a*, 50*b* are operated to supply the solutions from the solution supply tanks 50*a*, 50*b* to a selected one of the two mixing tanks 52*a*, 52*b*, and the stop valves 62*b* disposed in the processing liquid supply passages 74 are selectively opened and closed to supply the plating solution 54 from one of the mixing tanks 52*a*, 52*b* to the processing bath 56, as described above. Therefore, while the plating solution 54 produced in one of the mixing tanks 52*a* is being supplied to the processing bath 56, a new plating solution 54 may be produced in the other mixing tank 52*b*. As a result, any time lag is prevented from being caused in supplying a new plating solution to the processing bath 56.

Branch pipes 78 branched from the respective processing liquid supply passages 74 downstream of the liquid delivery pumps 72 and having respective stop valves 62*c* are connected respectively to the mixing tanks 52*a*, 52*b*. The branch pipes 78 serve as a mixing means for stirring and mixing the solutions that are supplied to the mixing tanks 52*a*, 52*b*. The mixing means operates as follows: While the supply of the plating solution 54 from the mixing tank 52*a* (or 52*b*) to the processing bath 56 is being stopped, the stop valve 62*c* connected to the mixing tank 52*a* (or 52*b*) is opened and the liquid delivery pump 72 connected thereto is operated to circulate the plating solution 54 in the mixing tank 52*a* (or 52*b*) through the branch pipe 78. In this manner, the solutions supplied to the mixing tank 52*a* (or 52*b*) are stirred and mixed uniformly into the plating solution 54 whose temperature has been uniformized.

The mixing tanks 52*a*, 52*b* have respective lower limit level sensors 150 for detecting a lower limit level for the plating solution 54 held in the mixing tanks 52*a*, 52*b*, and respective temperature sensors 152 (only one on the mixing tank 52*a* shown) for detecting the temperature of the plating solution 54. Output signals from the lower limit level sensors 150 are input to a controller 154, which produces an output signal to control the stop valves 62*b* in the processing liquid supply passages 74. Output signals from the temperature sensors 152 are input to a controller 156, which produces an output signal to control the temperature regulators 70*b*.

If the system is to use an electroless Ni—B plating solution heated to and kept at a temperature of 70° C., then two solutions preheated to a temperature in a range from 50 to 60° C. are supplied in given amounts to a selected one of the mixing tanks 52*a*, 52*b*, as described above. The supplied solutions are stirred and mixed into a plating solution 54, which is heated to and kept at a temperature of 70° C. by the temperature regulator 70*b* and supplied to the processing bath 56. Since the preheated solutions are mixed into the plating solution 54 in the mixing tanks 52*a*, 52*b* and the plating solution 54 is kept at the desired temperature by the temperature regulator 70*b*, even if the plating solution 54 is produced in a small amount, the temperature thereof is stabilized, and the plating solution 54 at the stable temperature can quickly be supplied to the processing bath 56. Each of the mixing tanks 52*a*, 52*b* may have a volume set to 2 liters, for example, so that a small amount of plating solution produced in the mixing tanks 52a, 52b can have its temperature stabilized.

The processing bath 56 is of the batch type wherein it stores a minimum given amount (e.g., 200 cc) of plating solution 54 required for performing plating process to process a predetermined number of substrates at one time. The processing bath 56 has a liquid level sensor (not shown) for monitoring the level 54a of the plating solution 54 stored in the processing bath 56. When the level 54a of the plating solution 54 detected by the liquid level sensor reaches a predetermined position, the stop valves 62b of the processing liquid supply passages 74 are closed to stop supplying the plating solution 54 to the processing bath 56.

The processing bath 56 has a temperature sensor 158 for detecting the temperature of the plating solution 54 in the processing bath 56. The temperature sensor 158 applies an output signal to a controller 156, which applies an output signal to control the temperature regulators 70b.

To the bottom of the processing bath 56, there is connected a plating solution discharge line 82 having a stop valve 62d and a liquid discharge pump 80a. The plating solution, which has been used in the processing bath 56, is basically discharged through the plating solution discharger 82. The plating solution discharge line 82 is connected to a plating solution return line 84 via a three-way valve 60b downstream of the liquid discharge pump 80am, in the present embodiment. With this arrangement, the plating solution, which is charged from the processing bath 56 through the plating solution discharge line 82, can be returned through the plating solution return line 84 to a selected one of the mixing tanks 52a, 52b via a three-way valve 60c disposed in the plating solution return line 84.

The processing bath 56 has a bottom wall 86 whose upper surface comprises a tapered surface 86a progressively lowered toward the center of the bottom wall 86 to which the plating solution discharge line 82 is connected. The tapered surface 86a of the bottom wall 86 allows the plating solution 54 to be drawn efficiently from the processing bath 56 into the plating solution discharge line 82.

The processing bath 56 is disposed in a heat-insulating tank 90 serving as a heat insulator for storing and circulating hot water 92 heated to the same temperature as the plating solution 54, e.g., a temperature of 70° C. The hot water 92 stored in the heat-insulating tank 90 heats the plating solution 54 and keeps it warm even if the plating solution 54, which has been heated in the mixing tanks 52a, 52b, has its temperature falling while flowing to the processing bath 56. The temperature of the plating solution 54 in the processing bath 56 is thus kept at a constant temperature of 70° C., for example, during the plating process.

Specifically, a hot water supply tank 94 having a temperature regulator 70c with a heater is connected to the heat-insulating tank 90 by a hot water supply pipe 98 having a circulation pump 96 and a stop valve 62e. The heat-insulating tank 90 is surrounded with an overflow dam 100 and a discharge groove 102 for discharging the hot water that has overflowed the overflow dam 100 from the hot water supply tank 94. The discharge groove 102 is connected to an end of a hot water return pipe 104 whose opposite end is connected to the hot water supply tank 94. The hot water 92 held in the heat-insulating tank 90 has a level 92a set to a position higher than the level 54a of the plating solution 54 stored in the processing bath 56.

The hot water 92, which has been heated to and held at a temperature of 70° C., for example, in the hot water supply tank 94 by the temperature regulator 70c, is supplied to the heat-insulating tank 90. The hot water 92, which has overflowed the overflow dam 100, returns to the hot water supply tank 94. In this manner, the hot water 92 circulates between the hot water supply tank 94 and the heat-insulating tank 90. While the hot water 92 is thus circulating, the plating solution 94 held in the processing bath 56 is fully submerged in the hot water 92 held in the heat-insulating tank 90. Therefore, the temperature of the plating solution 94 held in the processing bath 56 is equalized to the temperature of the hot water 92 held in the heat-insulating tank 90.

The hot water 92, which has a substantially constant temperature, thus circulates through the heat-insulating tank 90 for thereby uniformly heating the plating solution 54 in the processing bath 56. Because the plating solution 54 in the processing bath 56 is submerged in its entirety in a thermal medium such as the hot water 92 in the heat-insulating tank 90, even a small amount of plating solution 54 stored in the processing bath 56 can reliably be heated to and kept at a predetermined temperature. By giving a sufficient heat capacity to the hot water 92 stored in the heat-insulating tank 90, it is possible to perform an efficient heat exchange between the plating solution 54 in the processing bath 56 and the hot water 92 in the heat-insulating tank 90.

Figure 12:
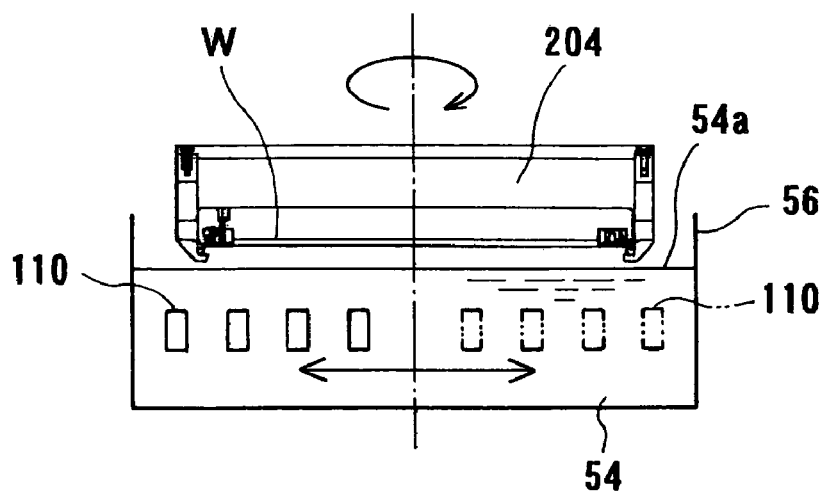
FIG. 12 is a schematic view of another processing bath.

As shown in FIG. 12, a stirring device comprising reciprocally movable paddles 110 may be disposed in the processing bath 56, and the plating solution 54 stored in the processing bath 56 may be stirred by the paddles (stirring device) 110 for uniformizing the temperature of the plating solution 54 in the processing bath 56.

Figure 7:
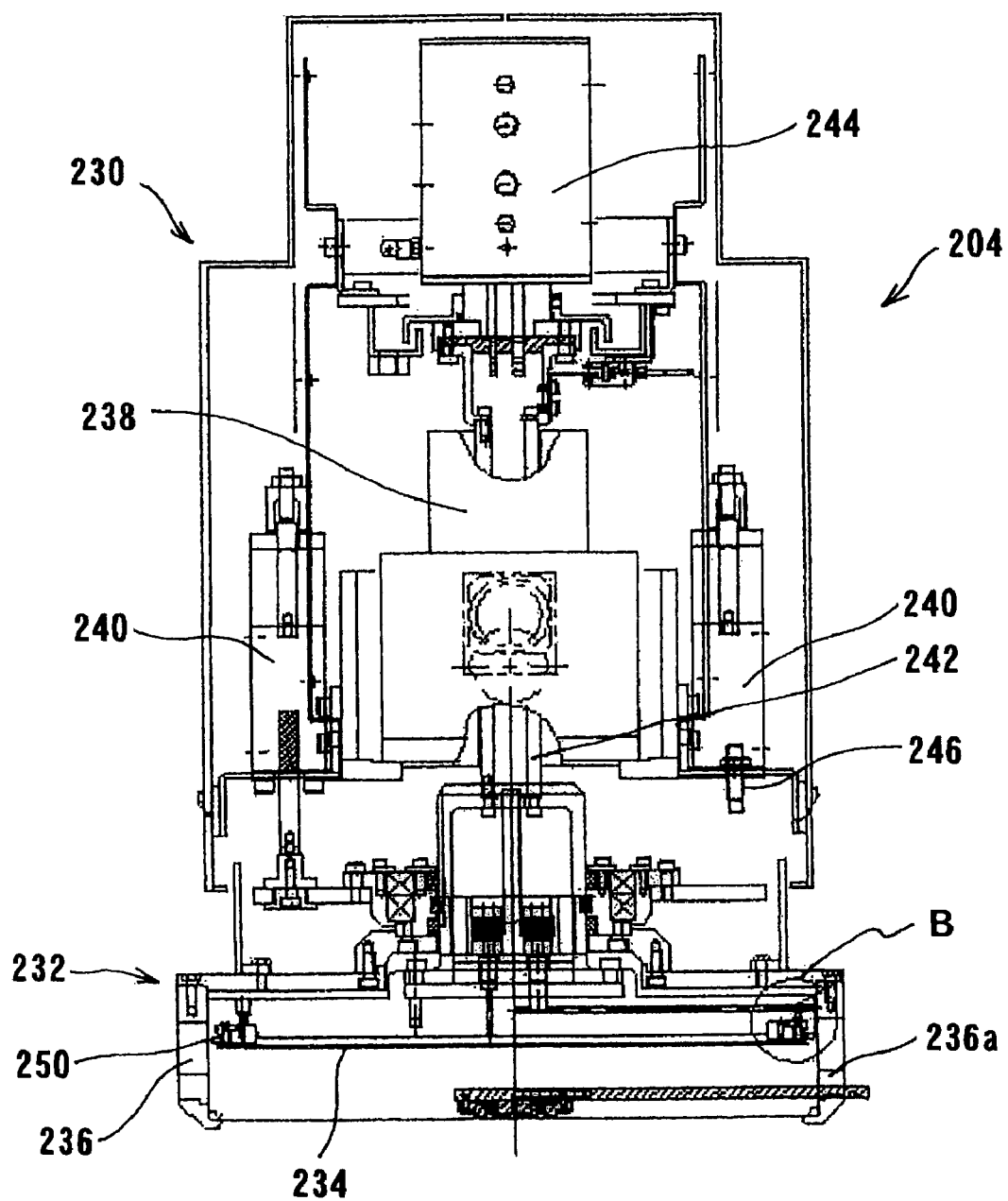
FIG. 7 is a cross-sectional view of a processing head at the time a substrate is transferred.

As shown in detail in FIG. 7, the processing head 204 has a housing 230 and a head assembly 232. The head assembly 232 mainly comprises a suction head 234 and a substrate receiver 236 for surrounding the suction head 234. The housing 230 accommodates therein a substrate rotating motor 238 and substrate receiver drive cylinders 240. The substrate rotating motor 238 has a hollow output shaft 242 having an upper end coupled to a rotary joint 244 and a lower end coupled to the suction head 234 of the head assembly 232. The substrate receiver drive cylinders 240 have respective rods coupled to the substrate receiver 236 of the head assembly 232. Stops 246 are mounted in the housing 230 for mechanically limiting upward movement of the substrate receiver 236.

The suction head 234 and the substrate receiver 236 are operatively connected to each other by a splined structure such that when the substrate receiver drive cylinders 240 are actuated, the substrate receiver 236 vertically moves relatively to the suction head 234, and when the substrate rotating motor 238 is energized, the output shaft 242 thereof is rotated to rotate the suction head 234 and the substrate receiver 236 in unison with each other.

Figure 8:
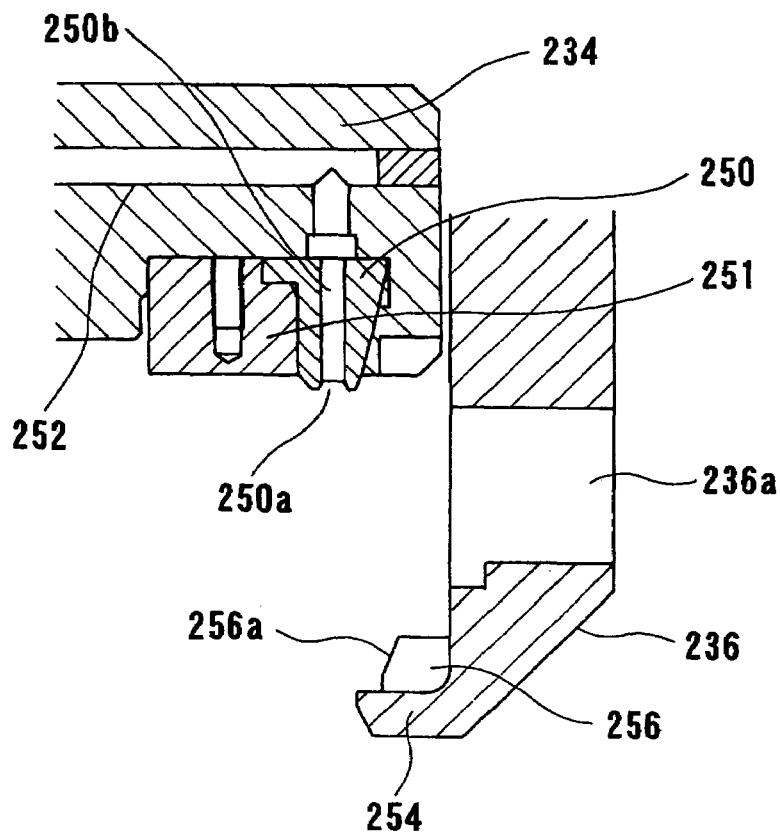
FIG. 8 is an enlarged fragmentary cross-sectional view of an encircled portion B shown in FIG. 7.
Figure 9:
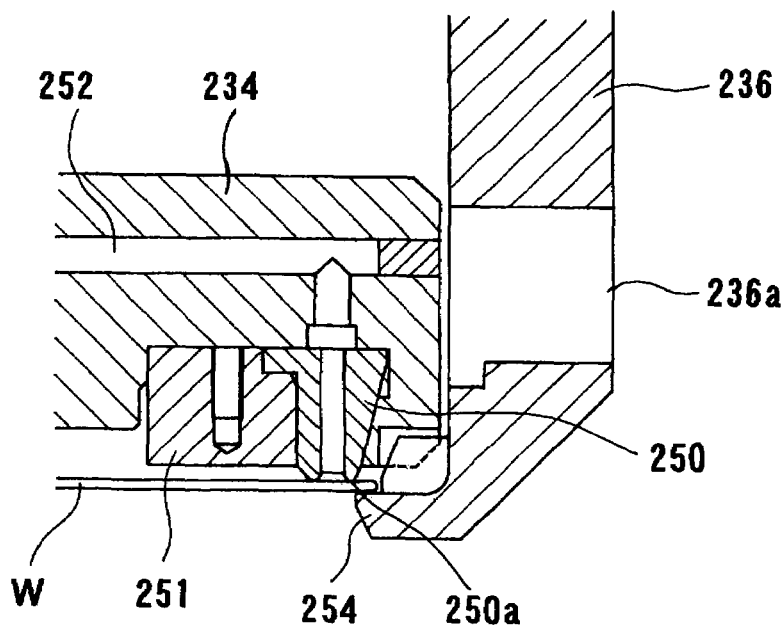
FIG. 9 is a view similar to FIG. 8, showing the processing head at the time a substrate is fixed.
Figure 10:
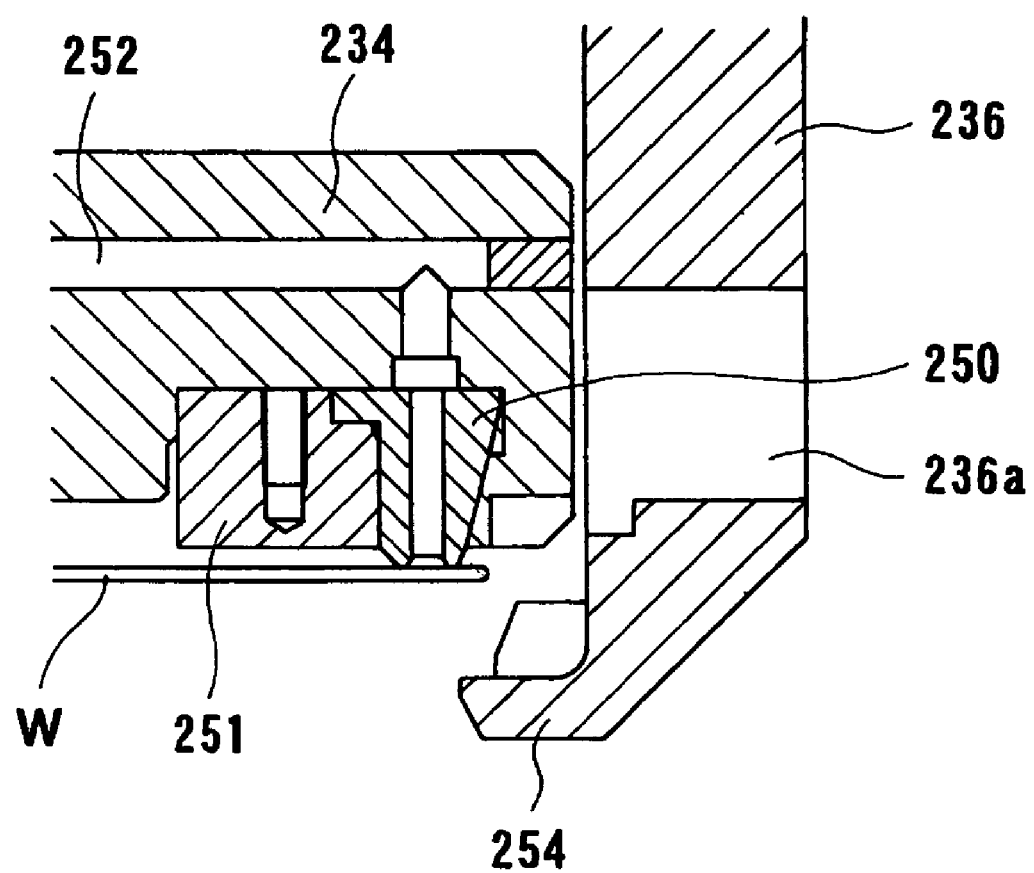
FIG. 10 is a view similar to FIG. 8, showing the processing head at the time a substrate is plated.

As shown in detail in FIGS. 8 through 10, a suction ring 250 for attracting and holding a substrate W against its lower surface to be sealed is mounted on a lower circumferential edge of the suction head 234 by a presser ring 251. The suction ring 250 has a recess 250a continuously defined in a lower surface thereof in a circumferential direction and held in communication with a vacuum line 252 extending through the suction head 234 by a communication hole 250b that is defined in the suction ring 250. When the recess 250a is evacuated, the substrate W is attracted to and held by the suction ring 250. Because the substrate W is attracted under vacuum to the suction ring 250 along a radially narrow circumferential area provided by the recess 250a, any adverse effects such as flexing caused by the vacuum on the substrate W are minimized. When the suction ring 250 is dipped in the plating solution, not only the surface (lower surface) of the substrate W, but also its circumferential edge, can be dipped in the plating solution. The substrate W is released from the suction ring 250 by introducing $N_2$ into the vacuum line 252.

The substrate receiver 236 is in the form of a downwardly open, hollow bottomed cylinder having a substrate insertion window 236a defined in a circumferential wall thereof for inserting therethrough a substrate W into the substrate receiver 236. The substrate receiver 236 also has an annular ledge 254 projecting inwardly from its lower end, and an annular protrusion 256 disposed on an upper surface of the annular ledge 254 and having a tapered inner circumferential surface 256a for guiding a substrate W.

As shown in FIG. 8, while the substrate receiver 236 is being lowered, the substrate W is inserted through the substrate insertion window 236a into the substrate receiver 236. The substrate W thus inserted is guided by the tapered surface 256a of the protrusion 256 and positioned there by onto the upper surface of the ledge 254 in a predetermined position thereon. The substrate receiver 236 is then elevated until it brings the upper surface of the substrate W placed on the ledge 254 into abutment against the suction ring 250 of the suction head 234, as shown in FIG. 9. Then, the recess 250a in the vacuum ring 250 is evacuated through the vacuum line 252 to attract the substrate W while sealing the upper peripheral edge surface of the substrate W against the lower surface of the suction ring 250. To plate the substrate W, as shown in FIG. 10, the substrate receiver 236 is lowered several mm to space the substrate W from the ledge 254, keeping the substrate W attracted by only the suction ring 250. The substrate W now has its lower peripheral edge surface prevented from not being plated because it is held out of contact with the ledge 254.

An electroless plating process using the above system for producing and circulating the plating solution will be described below.

The solution supplies 58 individually supply solutions to the solution supply tanks 50a, 50b, which hold predetermined amounts of supplied solutions. The solutions held in the solution supply tanks 50a, 50b are heated to and kept at a predetermined temperature ranging from 50 to 60° C. by the respective temperature regulators 70a. Then, the mixing tank 52a, for example, is supplied with the solutions held in the solution supply tanks 50a, 50b at a time. The stop valve 62b of the processing liquid supply passage 74 connected to the mixing tank 52a is closed and the stop valve 62c of the branch pipe 78 connected to the mixing tank 52a is opened. The liquid delivery pump 72 is actuated to stir the solutions supplied to the mixing tank 52a, and the temperature regulator 70b of the mixing tank 52a is operated to heat the solutions, which are mixed into a plating solution 54 at a predetermined temperature of 70° C., for example.

Based on a control signal from the controller 154, the/off valve 62b of the processing liquid supply passage 74 connected to the mixing tank 52a is opened and the stop valve 62c of the branch pipe 78 connected to the mixing tank 52a is closed. The liquid delivery pump 72 is actuated to supply a predetermined amount of the plating solution 54 produced in the mixing tank 52a to the processing bath 56. At this time, the hot water 92 at a predetermined temperature of 70° C., for example, is introduced into and circulated through the heat-insulating tank 90, thereby holding the plating solution 54 in the processing bath 56 at the constant temperature of 70° C., for example.

The substrate W to be plated is held by the processing head 204, and then lowered to contact the plating solution 54 in the processing bath 56. The surface of the substrate W held by the processing head 204 is now plated. The plated substrate W is then lifted out of the plating solution 54. The above process is repeated to plate a desired number of substrates W successively. After the desired number of substrates W have been plated, the plating solution 54 in the processing bath 56 is discharged therefrom through the plating solution discharge line 82. Thereafter, a predetermined amount of the plating solution 54 in the mixing tank 52a is supplied to the processing bath 56, and the above process is repeated.

At this time, the temperature of the plating solution 54 in the mixing tank 52a is detected with the temperature sensor 152, and the temperature of the plating solution 54 in the processing bath 56 is detected with the temperature sensor 158. Output signals from these temperature sensors 152, 158 are input to the controller 156. The controller 156 determines the difference between the temperatures represented by the supplied output signals, i.e., a temperature drop that the plating solution 54 undergoes while it is being supplied from the mixing tank 52a to the processing bath 56, and then controls the temperature regulator 70c to compensate for the temperature drop (temperature difference), for thereby being supplied the plating solution 54 at a constant temperature to the processing bath 56 at all times.

The mixing tank 52b, as described above, is also supplied with predetermined amounts of solutions held in the solution supply tanks 50a, 50b and heated to a predetermined temperature. In the mixing tank 52b, a plating solution 54 at a predetermined temperature of 70° C., for example, is produced and prepared by supplying solutions to the mixing tank 50b and mixing. The temperature regulator 70c is controlled, as described above, to compensate for a temperature drop (temperature difference) that the plating solution 54 undergoes while it is being supplied from the mixing tank 52a to the processing bath 56.

The lower limit level sensor 150 in the mixing tank 52a detects when the level of the plating solution 54 in the mixing tank 52a reaches a predetermined lower limit position. When an output signal from the lower limit level sensor 150 in the mixing tank 52a is input to the controller 154, the controller 154 produces an output signal to fully close the stop valve 62b of the processing liquid supply passage 74 interconnecting the mixing tank 52a and the processing bath 56, and control the opening and closing of the stop valve 62b of the processing liquid supply passage 74 interconnecting the mixing tank 52b and the processing bath 56. Now, the plating solution 54 to be supplied to the processing bath 56 is switched to the plating solution 54 in the mixing tank 52b prepared in advance. In this manner, the plating process is continued without interruptions in the supply of the plating solution 54 to the processing bath 56. Even when contaminants are introduced into the plating solution 54, e.g., an electroless plating solution that is generally unstable and easily decomposed, in one of the mixing tanks 52a, 52b and the plating solution 54 is contaminated by the introduced contaminants and can no longer be used as an effective processing liquid, it is only necessary to discard the contaminated plating solution 54 in the mixing tank. Therefore, the amount of the plating solution 54 to be discarded is much smaller than if the entire plating solution 54 in the system were to be discarded.

The lower limit level sensors 150 may be vertically positioned in the mixing tanks 52a, 52b at a position to leave in each of the mixing tanks 52a, 52b an amount of plating solution more than required to supply the processing liquid 56 in a single batch, so that even when each of the lower limit level sensors 150 detects a lower limit position, the mixing tank can supply the plating solution to the processing bath 56 continuously in the batch. Each of the mixing tanks 52*a*, 52*b* may produce an amount of plating solution which is required to be supplied in a batch to the processing bath 56, so that each batch of plating solution can be supplied alternately from the mixing tanks 52*a*, 52*b* to the processing bath 56.

The above system for producing and circulating the plating solution can meet requirements for efficiently mixing a plurality of solutions into a plating solution immediately before the plating solution is used. The system allows as many substrates as can be processed to be plated simultaneously with a minimum amount of plating solution which is required, and hence can consume the plating solution at high efficiency.

Figure 3:
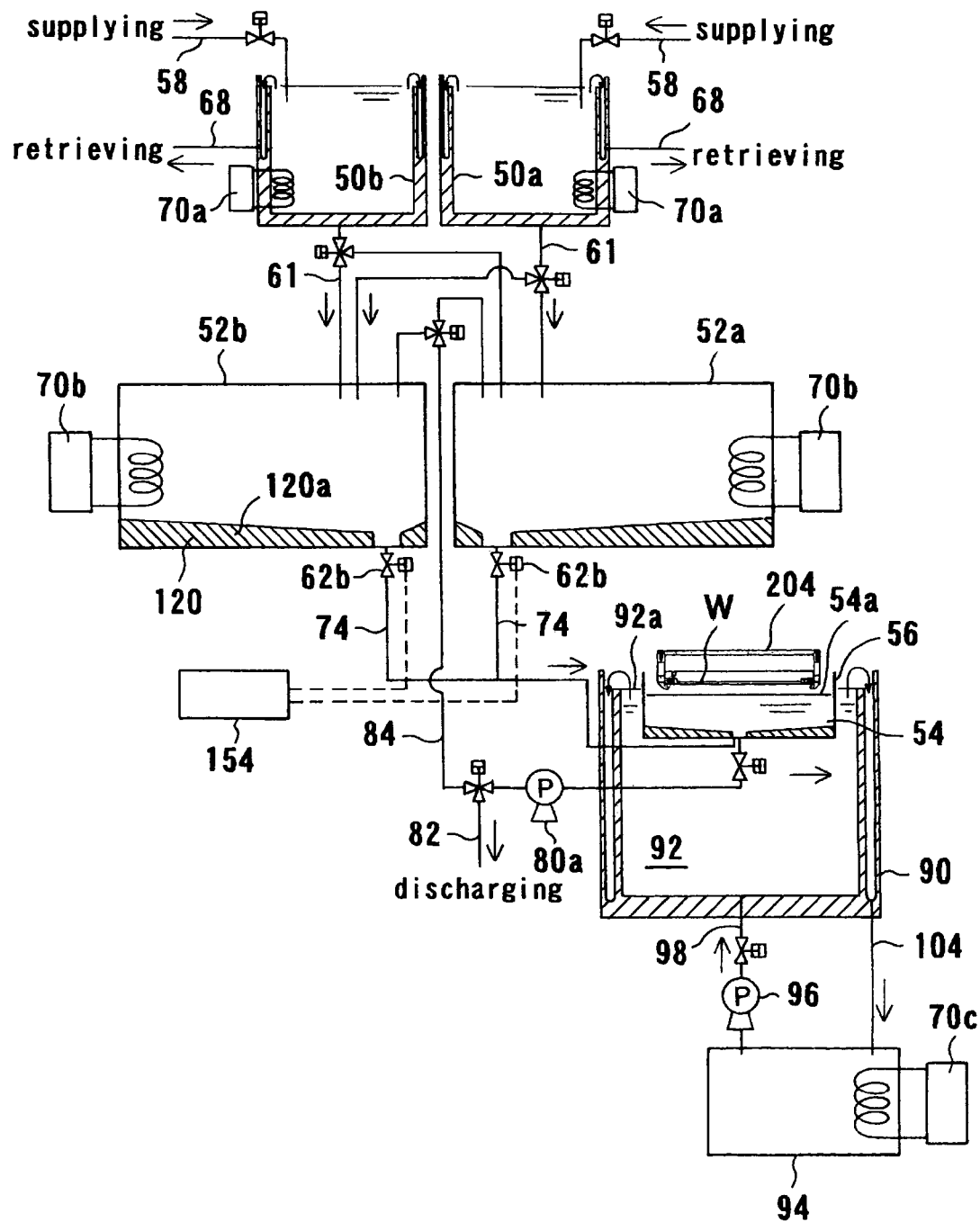
FIG. 3 is a schematic view of another system for producing and circulating a plating solution (processing liquid) in the electroless plating apparatus.
Figure 11:
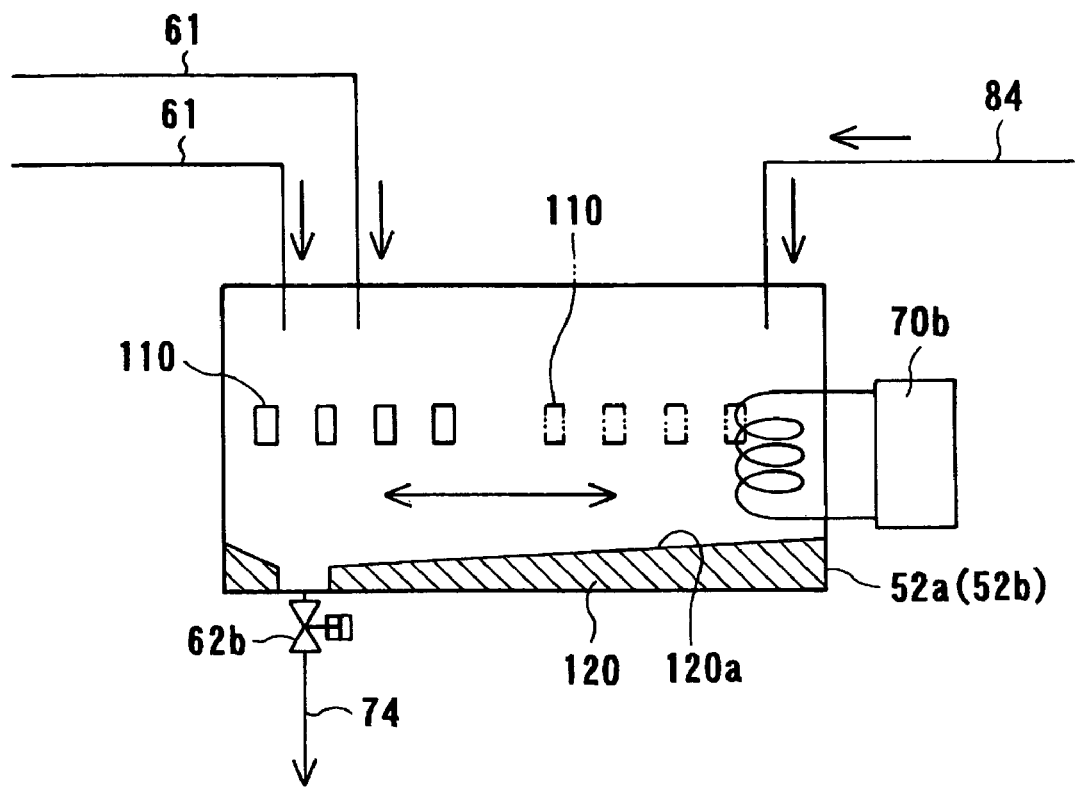
FIG. 11 is a schematic view of another mixing tank.

FIG. 3 schematically shows another system for producing and circulating a plating solution (processing liquid) in the above-described electroless plating apparatus. In the system illustrated in FIG. 3, the mixing tanks 52*a*, 52*b* are disposed above the processing bath 56, and the processing liquid supply passages 74 are connected to the respective bottoms of the mixing tanks 52*a*, 52*b*. The plating solution in the mixing tanks 52*a*, 52*b* is supplied by gravity to the processing bath 56 when the stop valves 62*b* of the processing liquid supply passages 74 are opened by a control signal from the controller 154. The mixing tanks 52*a*, 52*b* have respective bottom walls 120 whose upper surfaces comprise tapered surfaces 120*a* progressively lowered toward the draw portion of the bottom walls 120 to which the processing liquid supply passages 74 are connected. The tapered surfaces 120*a* of the bottom walls 120 allow the plating solution 54 to be drawn efficiently from the mixing tanks 52*a*, 52*b* into the processing liquid supply passages 74. Since the plating solution 54 is delivered by gravity to the processing bath 56, the processing liquid supply passages 74 do not need any liquid delivery pumps. As shown in FIG. 11, each of the mixing tanks 52*a*, 52*b* may incorporate paddles 110 movably disposed therein as a stirring means for stirring the plating solution 54 produced therein.

Figure 4:
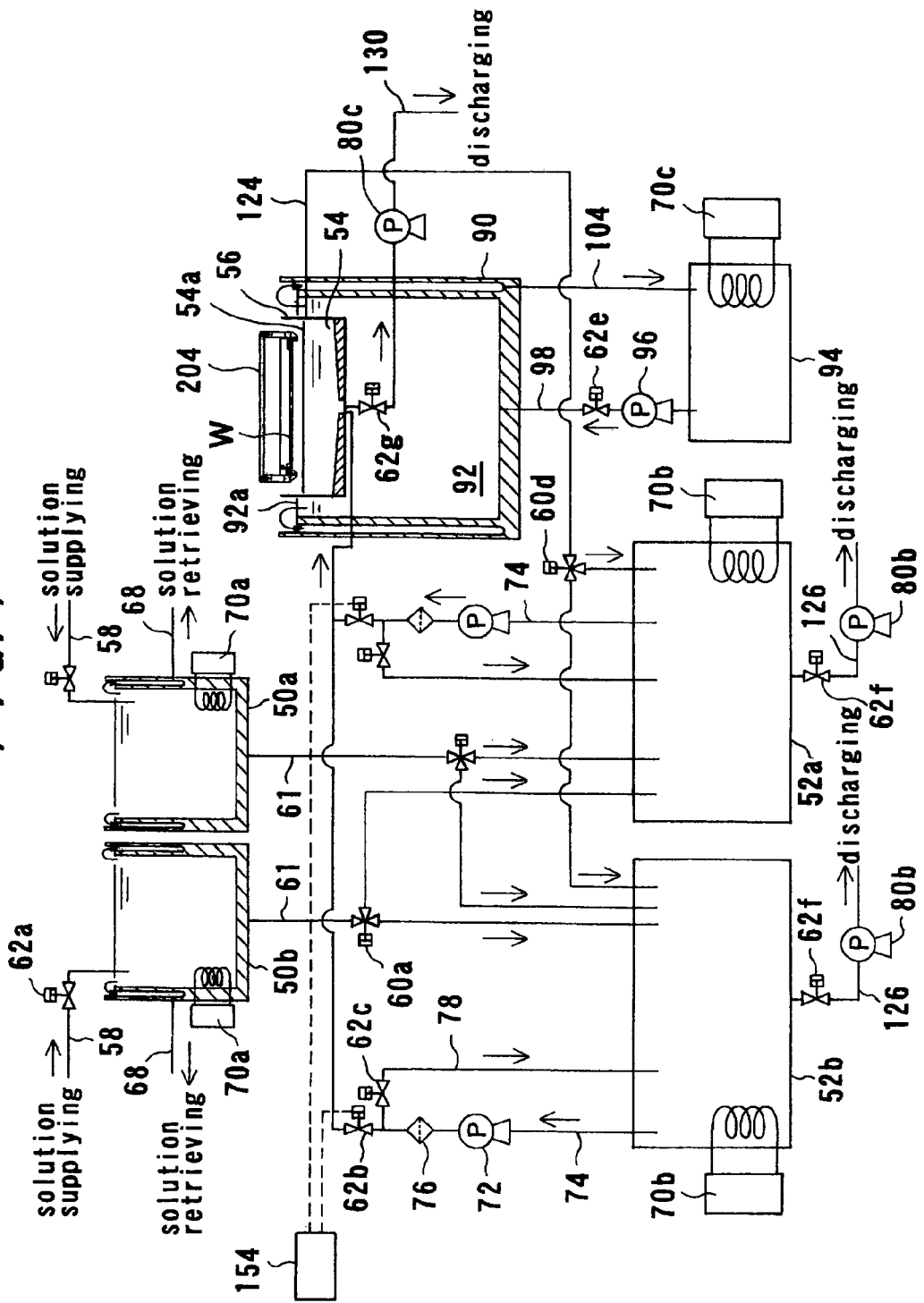
FIG. 4 is a schematic view of still another system for producing and circulating a plating solution (processing liquid) in the electroless plating apparatus.

FIG. 4 schematically shows still another system for producing and circulating a plating solution (processing liquid) in the above-described electroless plating apparatus. The system shown in FIG. 4 differs from the systems described above in that the plating solution 54 is circulated between the processing bath 56 and one of the mixing tanks 52*a* (or 52*b*) while substrates are being processed in the processing bath 56, and the supply of the plating solution 54 to the processing bath 56 is switched between the mixing tanks 52*a*, 52*b* based on the number of substrates to be processed according to an output signal from the controller 154.

Specifically, in the present embodiment, the plating solution 54 in the mixing tanks 52*a*, 52*b* is supplied through the processing liquid supply passages 74 to the processing bath 56 from the bottom thereof. The processing bath 56 has an overflow dam or a liquid discharge port (not shown). When the plating solution 54 is continuously supplied to the processing bath 56, the plating solution 54 overflows the overflow dam or overflows into the liquid discharge port, and then returns by gravity through a plating solution return line 124 to one of the mixing tanks 52*a*, 52*b* through a three-way valve 60*d*. The overflow dam or the liquid discharge port comprises a plurality of dam elements or port elements spaced at equal intervals or pitches in the circumferential direction of the processing bath 56 for leveling the plating solution 54 in the processing bath 56 when the plating solution 54 overflows the overflow dam or overflows into the liquid discharge port. Each of the mixing tanks 52*a*, 52*b* has a plating solution discharge line 126 connected to the bottom thereof for drawing and discharging the plating solution 54 from the mixing tanks 52*a*, 52*b*. The plating solution discharge line 126 has a stop valve 62*f* and a liquid discharge pump 80*b*. Similarly, the processing bath 56 has a plating solution discharge line 130 connected to the bottom thereof for drawing and discharging the plating solution 54 from the processing bath 56. The plating solution discharge line 130 has a stop valve 62*g* and a liquid discharge pump 80*c*. Other structural details of the system shown in FIG. 4 are identical to those of the systems described above.

For plating a substrate W in the processing bath 56 with the plating solution 54 in one of the mixing tanks 52*a*, for example, the stop valve 62*b* of the processing liquid supply passage 74 connected to the mixing tank 52*a* is opened and the liquid delivery pump 72 is actuated to continuously supply the plating solution 54 from the mixing tank 52*a* to the processing bath 56. The plating solution 54 that has overflowed the overflow dam or overflowed into the liquid discharge port is returned to the mixing tank 52*a* through the plating solution return line 124. In this manner, the plating solution 54 is circulated between the mixing tank 52*a* and the processing bath 56. After the desired number of substrates W have successively been processed, the liquid discharge pumps 80*b*, 80*c* are actuated to discharge the plate liquid 54 from the mixing tank 52*a* and the processing bath 56. After the plate liquid 54 have been discharged from the mixing tank 52*a* and the processing bath 56, the controller 154 switches the mixing tank 52*a* to the mixing tank 52*b*, and carries out the same plating process as described above.

Since the plating solution 54 is circulated between one of the mixing tanks 52*a*, 52*b* and the processing bath 56, the concentration of the plating solution 54 is prevented from dropping sharply, thus allowing the plating solution 54 to process an increased number of substrates W.

Figure 5:
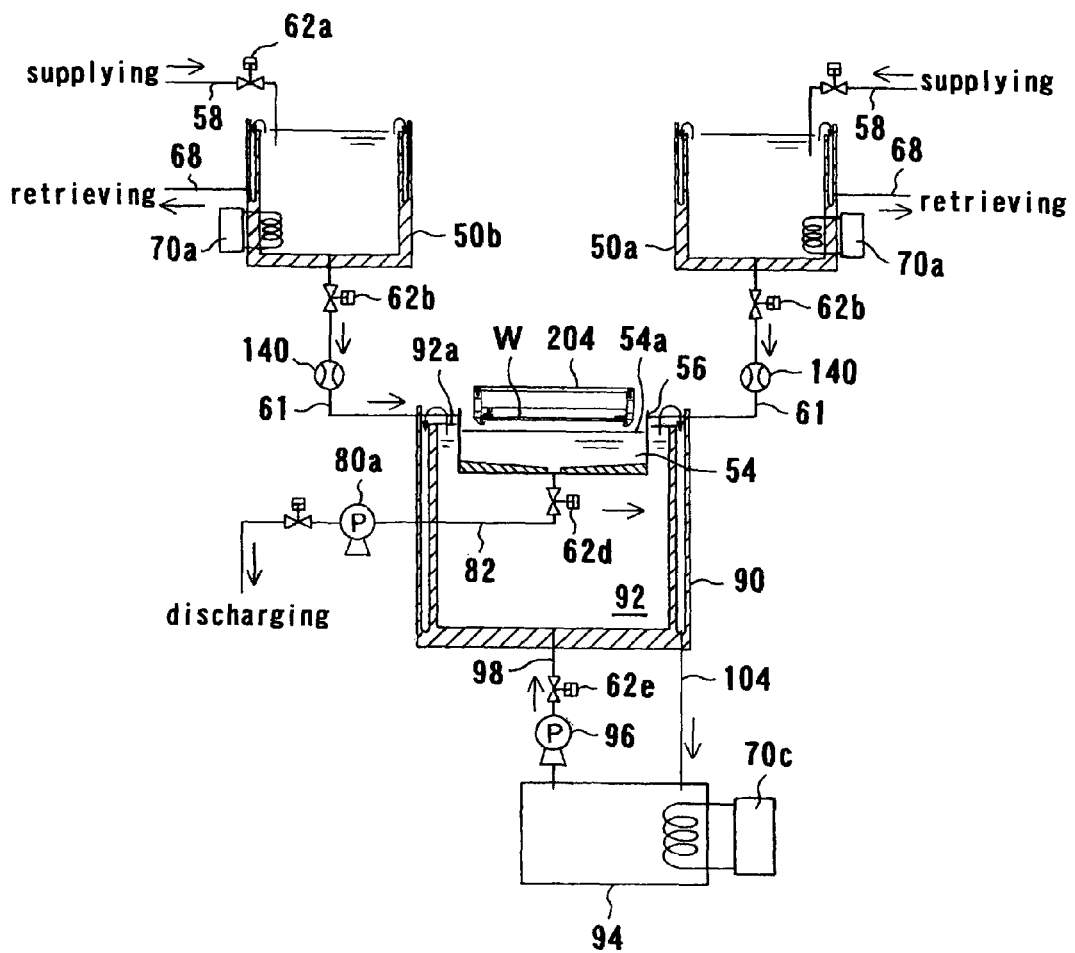
FIG. 5 is a schematic view of yet another system for producing and circulating a plating solution (processing liquid) in the electroless plating apparatus.
Figure 6:
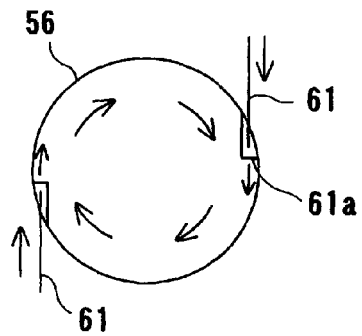
FIG. 6 is a plan view of a processing bath shown in FIG. 5.

FIGS. 5 and 6 schematically shows yet another system for producing and circulating a plating solution (processing liquid) in the above-described electroless plating apparatus. The system shown in FIGS. 5 and 6 does not employ any mixing tanks, but is arranged to introduce the solutions in the solution supply tanks 50*a*, 50*b* directly into the processing bath 56, in which the supplied solutions are mixed into a plating solution 54 and a substrate W is plated by being brought into contact with the plating solution 54 thus produced in the processing bath 56. Specifically, the solution supply passages 61 extending from the respective solution supply tanks 50*a*, 50*b* are directly connected to the processing bath 56, and have respective stop valves 62*b* and respective integrating flowmeters 140. As shown in FIG. 6, the solution supply passages 61 have their respective supply ports 61*a* positioned diametrically opposite to each other on the circumferential wall of the processing bath 56 and opening in one direction tangentially to the circumferential wall of the processing bath 56. The solutions supplied from the solution supply passages 61 flow out of the supply ports 61*a* and are mixed with each other as they fall along the inner surface of the circumferential wall while turning in one direction along the inner surface of the circumferential wall.

If the system is to use a plating solution heated to a temperature of, i.e., 70° C., then the solutions in the solution supply tanks 50*a*, 50*b* are heated to the temperature of the plating solution, i.e., 70° C., and the heated solutions are metered by the integrating flowmeters 140 in amounts required to produce the plating solution. The metered amounts of the solutions are then supplied to the processing bath 56, in which the supplied solutions are mixed into a plating solution 54. Other operational details of the system shown in FIGS. 5 and 6 are identical to those of the systems described above.

The system shown in FIGS. 5 and 6 are simpler than the systems described above because the mixing tanks are dispensed with.

According to the present invention, as described above, even when the amount of a processing liquid, e.g., a plating solution, to be used to process workpieces is small, the temperature of the processing liquid is stabilized, and a plurality of solutions can efficiently be mixed into the processing liquid immediately before the processing liquid is used to process the workpieces. Furthermore, the temperature of the processing liquid can be kept at a constant level at all times by managing the temperature of the processing liquid in the processing bath.

Figure 13:
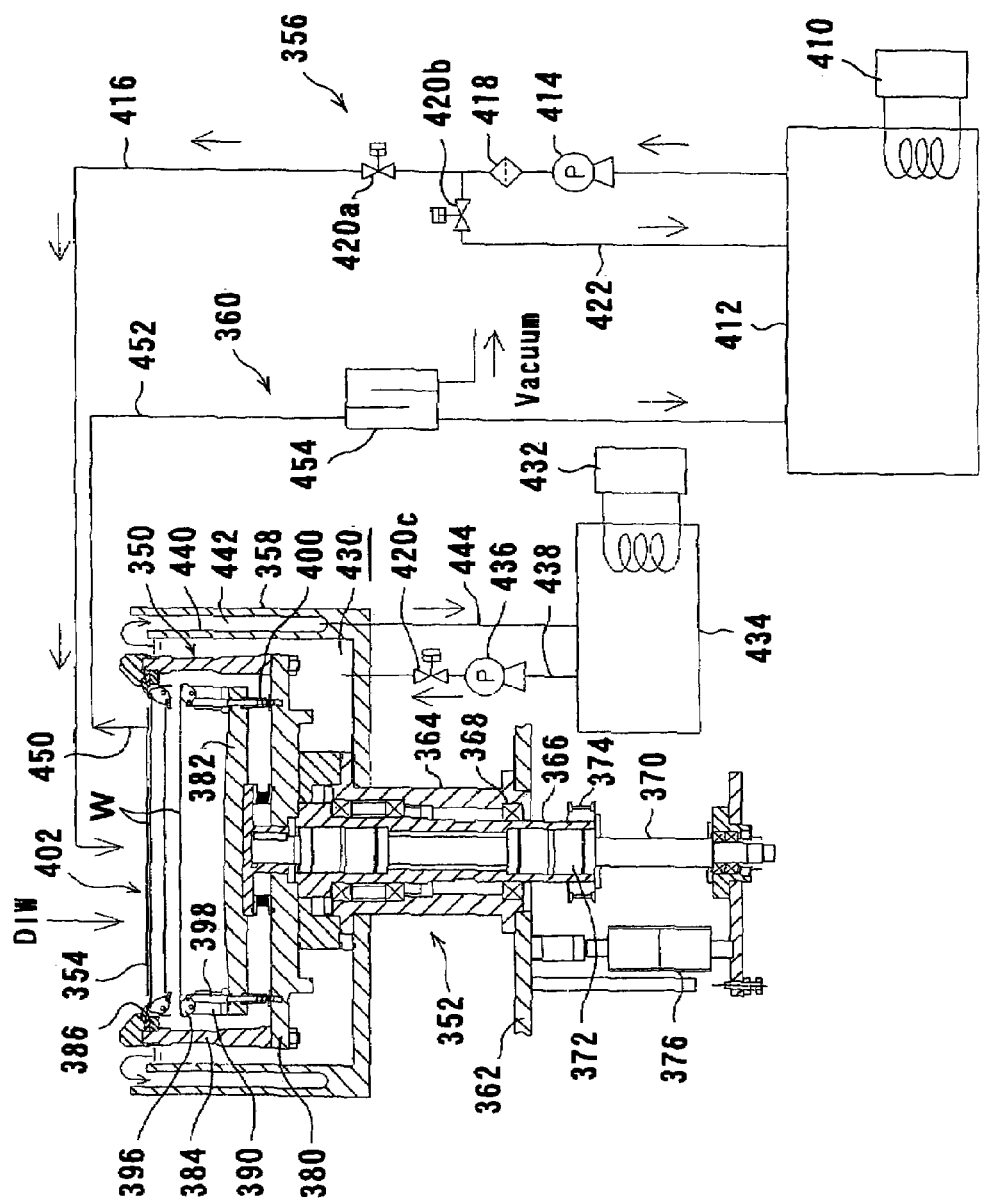
FIG. 13 is a schematic view of an electroless plating section in a substrate processing apparatus according to another embodiment of the present invention.
Figure 14:
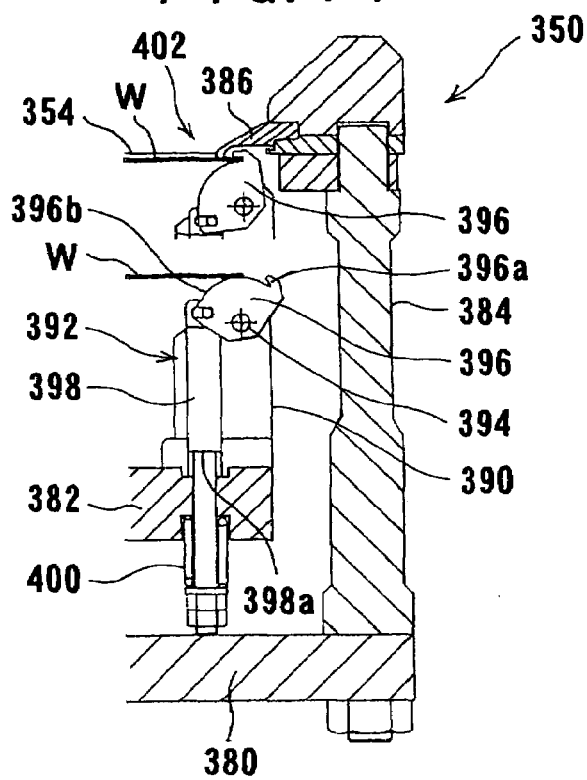
FIG. 14 is an enlarged fragmentary cross-sectional view of a substrate holder in the electroless plating section shown in FIG. 13.

FIG. 13 schematically shows an electroless plating section having the elecrtoless plating unit and the plating solution supplying device in a substrate processing apparatus (electroless plating apparatus) shown in FIG. 1. FIG. 14 shows in enlarged fragmentary cross section a substrate holder for detachably holding a substrate in the electroless plating section shown in FIG. 13.

The electroless plating section shown in FIG. 13 primarily comprises a processing head 352 having a substrate holder 350 for holding a substrate W with its surface to be processed facing upward (face up), a plating solution supplying system (processing liquid supplying system) 356 for supplying a plating solution (processing liquid) 354 to the processing head 352, a heat-insulating tank 358 for keeping the temperature of the plating solution 354 supplied to and held in the processing head 352 at a predetermined level, and a plating solution retrieving system (processing liquid retrieving system) 360 for retrieving the plating solution 354, which has processed the substrate W, from the processing head 352 and returning the retrieved plating solution 354 to the plating solution supplying system 356.

The processing head 352 has a hollow cylinder 364 mounted at its lower end on amount base 362. A main shaft 366 is rotatably supported in the hollow cylinder 364 by a bearing 368, and a spline shaft 370 is disposed in and operatively coupled to the main shaft 366 by splines 372 such that the spline shaft 370 can rotate in unison with the main shaft 366, but can move vertically with respect to the main shaft 366. A driven pulley 374 is fixedly mounted on the main shaft 366 below the mount base 362, and a timing bent (not shown) is trained around the driven pulley 374 and a drive pulley (not shown) mounted on the drive shaft of a motor (not shown). When the motor is energized, the main shaft 366 is rotated about its own axis. A lifting/lowering cylinder 376 is connected between the mount base 362 and the spline shaft 370 for vertically moving the spline shaft 370 with respect to the main shaft 366.

The substrate holder 350 comprises a disk-shaped support base 380, and a stage 382 vertically movably disposed above the support base 380. The support base 380 is connected to the upper end of the main shaft 366, and the stage 382 is connected to the upper end of the spline shaft 370. When the main shaft 366 is rotated about its own axis, the support base 380 and the stage 382 rotate in unison with each other. When the spline shaft 370 is moved vertically, the stage 382 is vertically moved with respect to the support base 380.

A cylindrical dam member 384 is mounted on an upper circumferential edge surface of the support base 380, and has an upper end extending to a position higher than an overflow dam 440 of the heat-insulating tank 358 for preventing a thermal medium (hot water) 430 in the heat-insulating tank 358 from flowing into the substrate holder 350. A seal ring 386 is mounted on the upper end of the dam member 384 with its outer circumferential edge gripped in position. The seal ring 386 has an inner circumferential edge projecting radially inwardly and extending downwardly for pressing and sealing the peripheral edge area of the upper surface, which is to be processed, of the substrate W, as described bellow.

As shown in detail in FIG. 14, a plurality of support arms 390 are erected on the outer circumferential edge of the stage 382 at spaced intervals therealong. Clamp mechanisms 392 for detachably holding a substrate W are disposed between the support arms 390 and the stage 382. Each of the clamp mechanisms 392 has a chuck rotor 396 rotatably mounted on the upper end of the support arm 390 by a pin 394, and a presser rod 398 vertically movably extending through the stage 392 up and down. The presser rod 398 is normally biased to move downwardly by a helical spring 400. The presser rod 398 has an upper end pivotally connected to the chuck rotor 396 at an inner position thereon that is radially spaced from the pin 394. The chuck rotor 396 has a grip tooth 396*a* disposed at an outer position thereon that is radially spaced from the pin 394.

The chuck rotor 396 has an upper arcuate rest surface 396*b* extending around the pin 394 for doubling as a temporary substrate rest. Specifically, when the chuck rotor 396 is angularly moved about the pin 394 to an open position with the grip tooth 396*a* positioned outwardly, as described above, a substrate W is dropped onto the chuck rotor 396 and temporarily placed on the upper arcuate rest surface 396*b*. When the chuck rotor 396 is angularly moved back to a closed position, the substrate W stays in the same vertical position on the upper arcuate rest surface 396*b* as it slides against the substrate W until the substrate W is held by the chuck rotor 396.

When the stage 382 is lowered with respect to the support base 380, the lower end of the presser rod 398 abuts against the upper surface of the support base 380, and the presser rod 398 is lifted with respect to the stage 382 against the bias of the helical spring 400. As the presser rod 398 is lifted, the chuck rotor 396 is turned outwardly to the open position. When the chuck rotor 396 is opened and the substrate W is temporarily placed on the upper arcuate rest surface 396*b*, the stage 382 is lifted with respect to the support base 380, causing the presser rod 398 to descend with respect to the stage 382 under the bias of the helical spring 400. Upon descent of the presser rod 398 with respect to the stage 382, the chuck rotor 396 is turned inwardly to the closed position in which the grip tooth 396*a* grips the outer circumferential edge of the substrate W, thereby holding the substrate W in position. At this time, a step 398*a* disposed in a given axial position on the presser rod 398 abuts against the stage 382, limiting further downward movement of the presser rod 398 with respect to the stage 382.

With the substrate W held by the chuck rotor 392, the stage 382 is further elevated to press the outer circumferential edge of the substrate W against the lower end surface of the seal ring 396, which now seals the outer circumferential edge of the substrate W. The upper surface, which is to be processed, of the substrate W and the seal ring 386 now jointly define a plating bath (processing bath) 402 for holding the plating solution 354 therein.

The plating solution supplying system 356, in the present embodiment, has a plating solution supply tank 412 with a temperature regulator 410 having a heater for heating the plating solution 354 stored in the plating solution supply tank 412 to, and keeping the plating solution 354 at, a predetermined temperature of 70° C., for example, and a plating solution supply passage 416 for supplying the plating solution 354 in the plating solution supply tank 412, with a liquid delivery pump 414, to a central region of the plating bath 402 which is defined by the upper surface of the substrate Wand the seal ring 386, as described above.

The plating solution supply passage 416 has a filter 418 and a stop valve 420*a* which are positioned downstream of the liquid delivery pump 414. A branch pipe 422 is branched from the plating solution supply passage 416 between the filter 418 and the stop valve 420*a* and has a stop valve 420*b*. The branch pipe 422 with the stop valve 420*b* serves as a stirring means for stirring the plating solution 354 in the plating solution supply tank 412. Specifically, the stop valve 420*a* is closed to stop supplying the plating solution 354 to the plating bath 402, and the stop valve 420*b* of the branch pipe 422 is opened and the liquid delivery pump 414 is actuated to circulate the plating solution 354 in the plating solution supply tank 412 through the branch pipe 422, for thereby uniformizing the temperature of the plating solution 354 in the plating solution supply tank 412.

The heat-insulating tank 358 stores and circulates the thermal medium (hot water) 430 which has been heated to the same temperature as the temperature of the plating solution 354, e.g., 70° C., for thereby heating, and keeping heat in, the plating solution 354 supplied to and held in the plating bath 402 in the processing head 352 to keep the plating solution 354 in the plating bath 402 at a constant temperature of 70° C., for example, at all times even if the temperature of the plating solution 354 drops before the plating solution 354 reaches the plating bath 402 or even during the plating process.

The heat-insulating tank 358 is mounted on the hollow cylinder 364 of the processing head 352 in a water-tight fashion so as to be open upwardly in surrounding relation to an upper portion of the processing head 352 which includes the substrate holder 350. The heat-insulating tank 358 is connected to a hot water supply tank 434 having a temperature regulator 432 with a heater, by a hot water supply pipe 438, which has a circulation pump 436 and a stop valve 420*c*. The heat-insulating tank 358 is surrounded with an overflow dam 440 and a discharge groove 442 for discharging the hot water that has overflowed the overflow dam 440 from the heat-insulating tank 358. The discharge groove 442 is connected to an end of a hot water return pipe 444 whose opposite end is connected to the hot water supply tank 434. The hot water 430 held in the heat-insulating tank 358 has a level set to a position higher than the level of the plating solution 354 stored in the plating bath 402.

The hot water 430, which is heated to and kept at 70° C., for example, by the temperature regulator 432 in the hot water supply tank 434, is supplied to the heat-insulating tank 358, and the hot water 430 which has overflowed the overflow dam 440 flows back to the hot water supply tank 434. While the hot water 430 is thus circulating, the plating solution 354 held in the plating bath 402 is fully submerged in the hot water 430 held in the heat-insulating tank 358. Therefore, the temperature of the plating solution 354 held in the plating bath 402 is equalized to the temperature of the hot water 430 held in the heat-insulating tank 358.

The hot water 430, which has a substantially constant temperature, thus circulates through the heat-insulating tank 358, for thereby uniformly heating the plating solution 354 in the plating bath 402. Because the plating solution 354 in the plating bath 402 is submerged in its entirety in a thermal medium such as the hot water 430 in the heat-insulating tank 358, even a small amount of plating solution 354 stored in the plating bath 402 can reliably be heated to and kept at a predetermined temperature. By giving a sufficient heat capacity to the hot water 430 stored in the heat-insulating tank 358, it is possible to perform an efficient heat exchange between the plating solution 354 in the plating bath 402 and the hot water 430 in the heat-insulating tank 358.

During the plating process, the substrate holder 350, which is holding the substrate W, is rotated to stir the hot water 430 as the thermal medium to uniformize the temperature of the hot water 430. The substrate holder 350, which is holding the substrate W, is exposed to the hot water 430 to keep its temperature. Accordingly, all the elements that are involved in keeping the temperatures of the plating solution 354 and the substrate W are managed in temperature to reliably prevent the temperature of the plating solution 354 from changing and also the temperature of the substrate W from suffering variations during the plating process.

The plating solution retrieving system 360 serves to retrieve the plating solution 354 which has been used to plate the substrate W and remains left on the upper surface, which is to be processed, of the substrate W, and return retrieved plating solution to the plating solution supply tank 412 of the plating solution supplying system 356. The plating solution retrieving system 360 has a nozzle 450 movable toward the upper surface of the substrate W held by the substrate holder 350, and a plating solution retrieval passage 452 interconnecting the nozzle 450 and the plating solution supply tank 412. The plating solution retrieval passage 452 has a gas-liquid separator 454 having a drawing means, which comprises a vacuum pump, an ejector, etc. The plating solution 354 which has been used to plate the substrate W is drawn by the nozzle 450 under vacuum, and retrieved through the gas-liquid separator 454 to the plating solution supply tank 412.

A plating process, which is performed by the electroless plating unit shown in FIG. 13, will be described below.

The stage 382 of the substrate holder 350 is lowered to open the chuck rotors 396, and the substrate W is dropped from above the substrate holder 350 onto the upper arcuate rest surfaces 396*b* of the chuck rotors 396. After the substrate W has been temporarily positioned on the upper arcuate rest surfaces 396*b*, the stage 382 is lifted to close the chuck rotors 396 to hold the substrate W with the substrate holder 350. The stage 382 is further elevated to press the seal ring 386 against the outer circumferential edge of the substrate W held by the substrate holder 350, thus sealing the outer circumferential edge of the substrate W with the seal ring 386. Now, the plating bath 402 is defined by the upper surface, which is to be processed, of the substrate W and the seal ring 386. At this time, the hot water 430 at a predetermined temperature of 70° C., for example, is introduced from the hot water supply tank 434 into the heat-insulating tank 358 and circulated between the heat-insulating tank 358 and the hot water supply tank 434.

The plating solution 354 in the plating solution supply tank 412 is stirred by being circulated through the branch pipe 422, and heated to, and kept at, a predetermined temperature of 70° C., for example, by the temperature regulator 410.

The main shaft 366 of the processing head 352 is rotated to rotate the substrate holder 350, which is holding the substrate W, i.e., the support base 380 having the seal ring 386 and the stage 382 having the chuck rotors 396 in unison with each other. At the same time, the plating bath 402 defined by the upper surface of the substrate W and the seal ring 386 is supplied with the plating solution 354 from the plating solution supply tank 412 through the plating solution supply passage 416. The plating solution 354 supplied to the central portion of the plating bath 402 is distributed all over the upper surface of the substrate W under centrifugal forces produced by the rotation of the substrate W, thus plating the upper surface of the substrate W with the plating solution 354 which is brought into contact therewith. At this time, the plating solution 354 maybe supplied to the substrate W in a minimum amount that is required to plate the substrate W.

If necessary, the rotational speed of the substrate holder 350 is controlled or the substrate holder 350 is held at rest to plate the substrate W for a given period of time. Thereafter, the nozzle 450 of the plating solution retrieving system 360 draws the plating solution 354 from the plating bath 402, and returns the plating solution 354 to the plating solution supply tank 412 of the plating solution supplying system 356. Then, the surface of the substrate W is rinsed with pure water. Subsequently, the substrate holder 350 is stopped against rotation, and the stage 382 is lowered to release the plated substrate W. The plated substrate W is then carried to a next process by a transfer robot or the like.

Plating process, which is performed by electroless plating unit shown in FIGS. 13 and 14, may be performed as a face-up plating process, which allows air bubbles to be removed well and generally uses a small amount of plating solution in one plating cycle. Even if a small amount of plating solution is supplied to and held in the processing head, the temperature of the plating solution is prevented from changing during the plating process. In addition, the plating solution that has been used to plate the substrate can be retrieved and reused, for thereby minimizing the amount of plating solution used.

Figure 15:
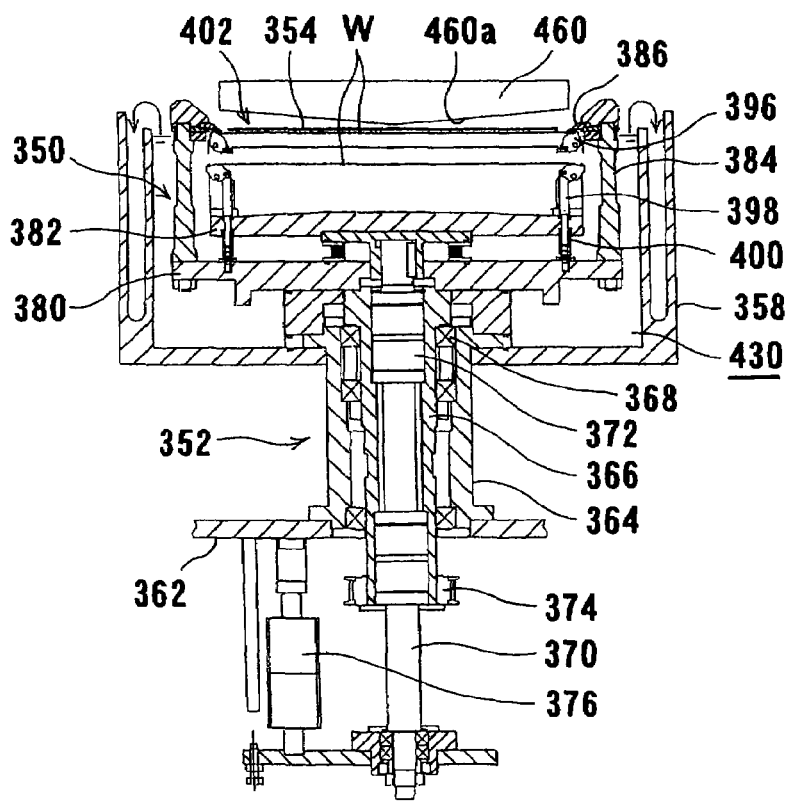
FIG. 15 is a cross-sectional view of another processing head.

FIGS. 15 and 16A through 16C show another processing head 352. As shown in FIG. 15, the processing head 352 has a heating head 460 vertically movably disposed above the substrate holder 350 for controlling the temperature of the plating solution 354 that is supplied to and held in the plating bath 402, which is defined by the upper surface of the substrate W and the seal ring 386. The heating head 460 is brought into contact with the plating solution 354 in the plating bath 402 to heat the plating solution 354 during the plating process. Other structural details of the processing head 352 are identical to those of the processing head 352 shown in FIGS. 13 and 14.

The heating head 460 has a diameter slightly smaller than the inside diameter of the seal ring 386. The heating head 460 has a lower surface 460a for contacting the plating solution 354, the lower surface 460a being tapered into a conical surface which is progressively inclined upwardly from the center thereof in the radially outward direction.

Figure 16A:
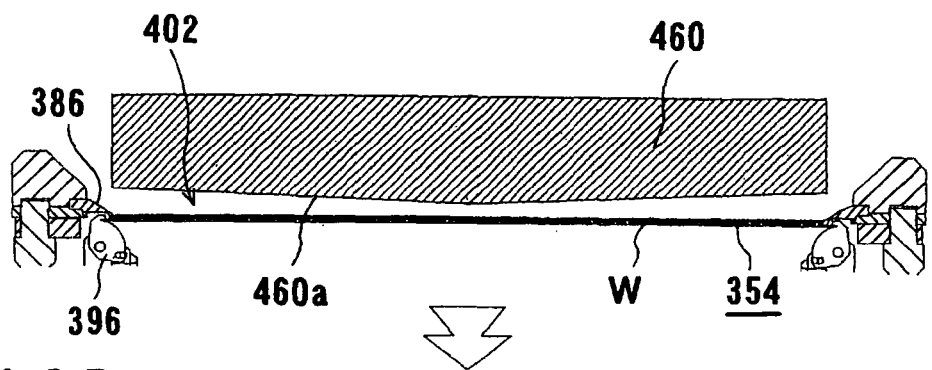
FIGS. 16A through 16C are cross-sectional views showing a sequence of bringing a heading head of the processing head shown in FIG. 15 into contact with a plating solution.
Figure 16B:
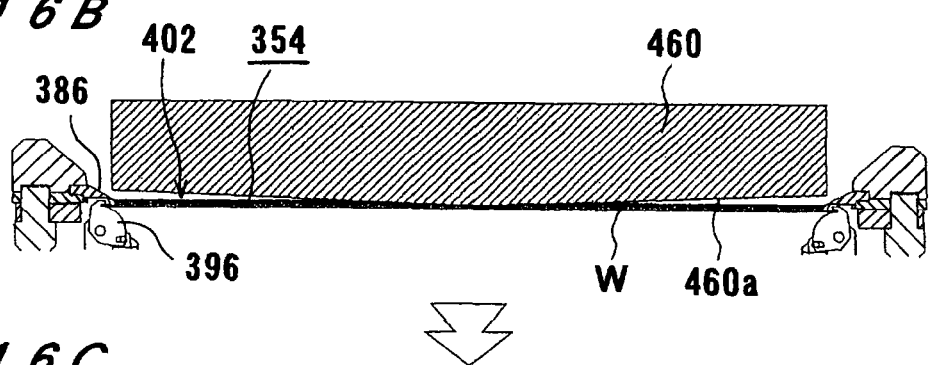
Figure 16C:
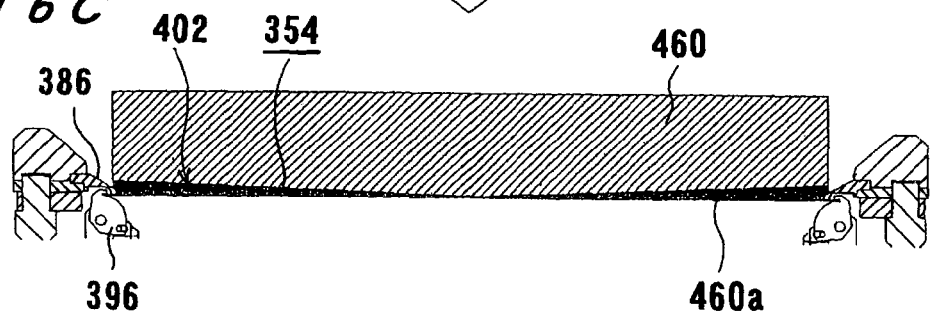

Since the processing head 352 has the heating head 460 for contacting and heating the plating solution 354 held in the plating bath 402 and the plating solution 354 held in the plating bath 402 is directly and uniformly heated by the heating head 460 during the plating process, the plating solution 354 is prevented from having different temperatures at positions over the central and peripheral regions of the substrate W. Furthermore, because the lower surface 460a of the heating head 460 for contacting the plating solution 354 is tapered, as shown in FIGS. 16A through 16C, when the lower surface 460a of the heating head 460 contacts the plating solution 354, the region of the lower surface 460a that contacts the plating solution 354 is progressively spread uniformly from the central region toward the outer circumferential region of the heating head 460, thereby preventing air pockets from being developed in the interface between the heating head 460 and the plating solution 354.

FIG. 17 schematically shows another electroless plating section. The electroless plating section shown in FIG. 17 differs from the electroless plating section shown in FIGS. 13 and 14 in that it has a plating solution supply tank 470 with no temperature regulator, i.e., a plating solution supply tank 470 for storing a plating solution 354 that is cold (mild and inactive) at all times, rather than the plating solution supply tank 112 shown in FIG. 13, and that the plating solution supply passage 416 is combined with a temperature regulator 472 having a heater, such as an in-line heater or the like, for instantaneously heating the plating solution 354 to 70° C., for example, and the plating solution retrieval passage 452 of the plating solution supply passage 416 is combined with a temperature regulator 474 having a cooler for cooling the plating solution 354 to a cold (mild and inactive) state.

The electroless plating unit shown in FIG. 17 performs a plating process using an electroless plating solution which has such properties that when the electroless plating solution reaches a certain temperature or higher, it is activated and tends to react with various substances. The temperature regulator 472 with the heater heats only a required amount of electroless plating solution to a predetermined temperature while it is being supplied to the plating bath, so that the consumption of the processing liquid such as electroless plating solution is prevented from increasing due to the decomposition thereof at high temperatures. The temperature regulator 474 with the cooler cools the plating solution 354 to a cold (mild and inactive) state when the plating solution 354 is retrieved. Therefore, when the plating solution 354 is retrieved to the plating solution supply tank 470, at least a portion of the plating solution 354 is prevented from having a higher temperature in the plating solution supply tank 470.

Figure 18:
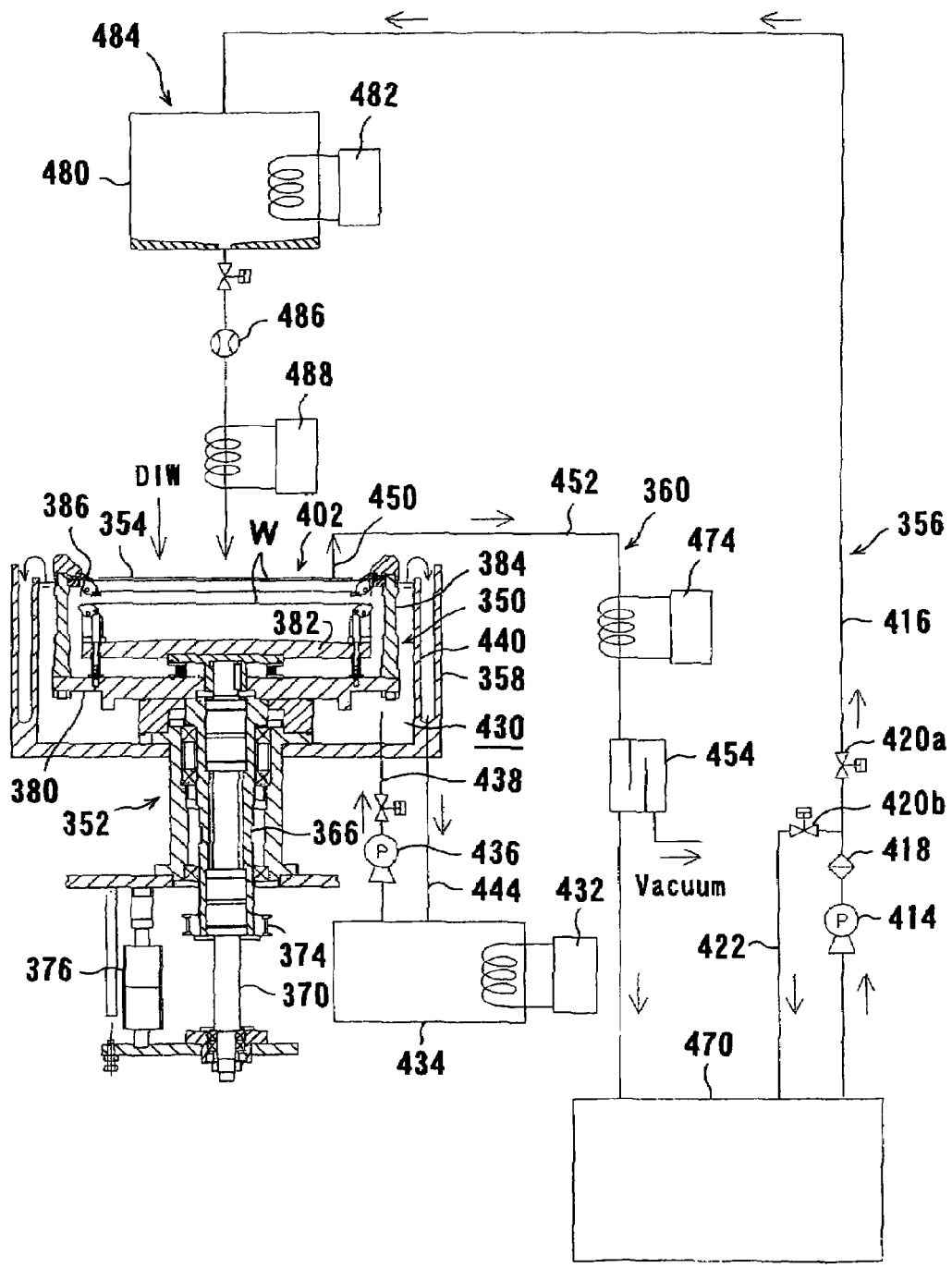
FIG. 18 is a schematic view of still another electroless plating section.

FIG. 18 schematically shows still another electroless plating section. The electroless plating section shown in FIG. 18 differs from the electroless plating section shown in FIG. 17 in that the plating solution supply passage 416 is combined with, rather than the temperature regulator 472 shown in FIG. 17, a temperature regulating device 484 comprising an intermediate tank 480 for temporarily holding the plating solution 354 therein and a temperature regulator 482 having a heater for heating the plating solution 354 in the intermediate tank 480 to a temperature of 70° C., for example, and keeping the plating solution 354 at that temperature. The plating solution supply passage 416 is also combined with a flow rate regulator 486 and an auxiliary temperature regulator 488, which are positioned downstream of the temperature regulating device 484. The auxiliary temperature regulator 488 serves to prevent the temperature of plating solution 354 from dropping when the plating solution 354 flows from the temperature regulating device 484 to the plating bath 402. The auxiliary temperature regulator 488 may be replaced with heat insulation materials.

With the electroless plating section shown in FIG. 18, only the plating solution 354 to be used in a plurality of plating cycles maybe introduced into the intermediate tank 480, and heated to and kept at a predetermined temperature of 70° C., for example, and then a predetermined amount of the heated plating solution 354 may be supplied from the intermediate tank 480 to the plating bath 402. According to the above plating solution supplying scheme, a smaller-size heater may be used as the temperature regulating device 484, and temperature management process may be carried out easily and reliably.

Figure 19:
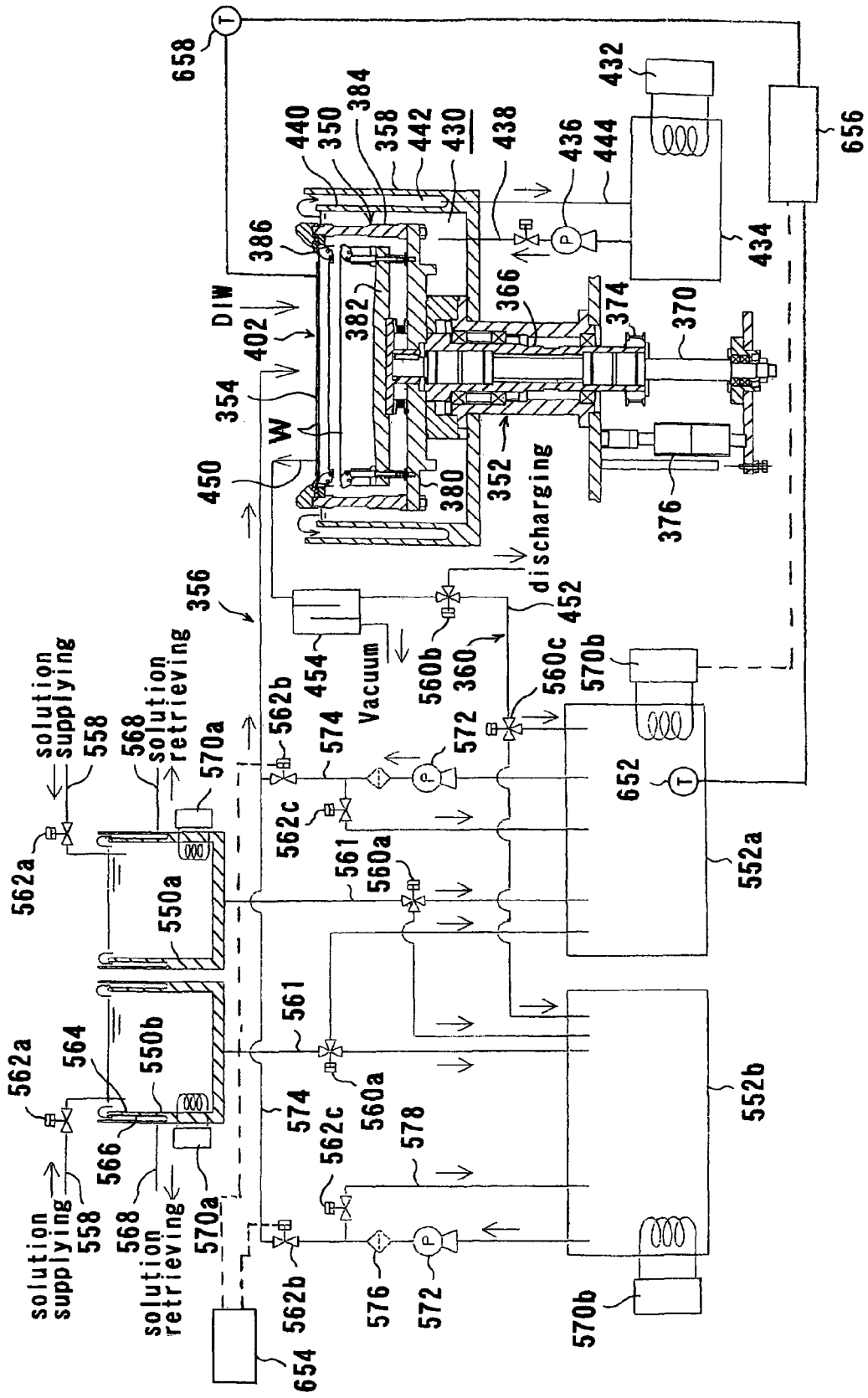
FIG. 19 is a schematic view of yet another electroless plating section.

FIG. 19 schematically shows yet another electroless plating section. The electroless plating section shown in FIG. 19, in the present embodiment, includes a plating solution supplying system 356 having a plurality of, two in the illustrated embodiment, solution supply tanks 550a, 550b for individually holding a plurality of solutions which are to be mixed into a plating solution, and a plurality of, two in the illustrated embodiment, mixing tanks 552a, 552b for mixing two solutions individually supplied from the two solution supply tanks 550a, 550b to produce a plating solution. A plating solution retrieving system 360 serves to retrieve the plating solution, which has been used to plate a substrate W, to one of the mixing tanks 552a, 552b of the plating solution supplying system 356.

One of the solution supply tanks 550a holds a solution containing only a reducing agent for a plating solution component, e.g., dimethylamine borane (DMAB) or hydrogen boride compound as a reducing agent for nickel ions, if an electroless Ni—B plating solution is to be produced. The other solution supply tank 550b holds a solution containing other plating solution components, e.g., nickel ions, a complexing agent for nickel ions, TMAH (tetramethylammonium hydroxide), and other components, if an electroless Ni—B plating solution is to be produced.

The number of solution supply tanks used depends on the type of a processing liquid to be used to process a substrate, e.g., the type of an electroless plating solution to be used in an electroless plating process. Stated otherwise, there are employed as many solution supply tanks as necessary to keep solutions to be mixed into a processing liquid such as a plating solution in safe storage against reaction even when heated.

To the solution supply tanks 550a, 550b, there are connected respective solution supplies 558 such as house lines for individually supplying solutions to the solution supply tanks 550a, 550b, and respective solution supply passages 561 for drawing the solutions stored in the solution supply tanks 550a, 550b through their bottoms and supplying the solutions by gravity to a selected one of the mixing tanks 552a, 552b through respective three-way valves 560a. Each of the solution supplies 558 has a stop valve 562a. The solution supply tanks 550a, 550b are surrounded by respective overflow dams 564 of given height and respective retrieval grooves 566 for retrieving solutions that have overflowed the overflow dams 564 from the solution supply tanks 550a, 550b. The retrieval grooves 566 are connected to respective solution retrieval passages 568 for retrieving the overflowing solutions. The overflow dams 564, the retrieval grooves 566, and the retrieval passages 568 jointly make up a metering device for supplying the mixing tanks 552a, 552b with amounts of solutions that are required to produce a desired plating solution. Specifically, when solutions stored in the solution supply tanks 550a, 550b exceed a predetermined amount, the solutions overflow the overflow dams 564 into the retrieval grooves 566. Therefore, the solutions are held in the predetermined amount in the solution supply tanks 550a, 550b. The amount held in each of the solution supply tanks 550a, 550b is set to a necessary amount to produce a plating solution for each solution. The solution supply tanks 550a, 550b are combined with respective detecting means, such as level sensors or the like, for detecting when the solutions in the solution supply tanks 550a, 550b start overflowing into the retrieval grooves 566. In response to signals from the detecting means, the stop valves 562a are closed to stop supplying the solutions from the solution supplies 558 to the solution supply tanks 550a, 550b.

The solution supply tanks 550a, 550b are also combined with respective temperature regulators 570a having heaters for heating the solutions held in the solution supply tanks 550a, 550b to predetermined temperatures and keeping the solutions at the predetermined temperatures, respectively. If the system is to use an electroless Ni—B plating solution at a temperature of 70° C., then the solutions held in the solution supply tanks 550a, 550b are preheated to a temperature in a range from 50 to 60° C., for example, by the temperature regulators 570a, and the solutions thus preheated are supplied in given amounts to a selected one of the mixing tanks 552a, 552b.

The solutions held in the solution supply tanks 550a, 550b are solutions that can stably be stored even at increased temperatures before they are mixed into a plating solution, which is easily reactive and hence unstable at high temperatures. Therefore, the solutions held in the solution supply tanks 550a, 550b are prevented from reacting and being decomposed even when they are preheated prior to being mixed together.

In the present embodiment, the metering device for supplying a predetermined amount of solution from the solution supply tanks 50a, 50b to a selected one of the mixing tanks 552a, 552b includes the overflow dam 564. Alternatively, the metering device may comprise a pump or a measuring device, such as a load cell, an integrating flowmeter, or the like, for controlling the amount of solution to be supplied.

The mixing tanks 552a, 552b, as described above, serve to mix predetermined amounts of preheated solutions supplied from the solution supply tanks 550a, 550b into the plating solution 354. The mixing tanks 552a, 552b are combined with respective temperature regulators 570b having heaters for heating the plating solution 354 produced in the mixing tanks 552a, 552b to a predetermined temperature and keeping the plating solution 354 at the predetermined temperature. The plating solution 354 produced and heated in the mixing tanks 552a, 552b is delivered by liquid delivery pumps 572 disposed respectively in plating solution supply passages 574 through the plating solution supply passages 574 to the plating bath 502, successively. Each of the plating solution supply passages 574 has a filter 576 and a stop valve 562b.

In the present embodiment, the three-way valves 560a disposed in the solution supply passages 561 extending from the solution supply tanks 550a, 550b are operated to supply the solutions from the solution supply tanks 550a, 550b to a selected one of the two mixing tanks 552a, 552b, and the stop valves 562b disposed in the plating solution supply passages 574 are selectively opened and closed to supply the plating solution 354 from one of the mixing tanks 552a, 552b to the plating tank 402. Therefore, while the plating solution 354 produced in one of the mixing tanks 552a is being supplied to the plating tank 402, a new plating solution 354 may be produced in the other mixing tank 552b. As a result, any time lag is prevented from being caused in supplying a new plating solution to the processing bath 56.

Branch pipes 578 branched from the respective plating solution supply passages 574 downstream of the liquid delivery pumps 572 and having respective stop valves 562c are connected respectively to the mixing tanks 552a, 552b. The branch pipes 578 serve as a mixing means for stirring and mixing the solutions that are supplied to the mixing tanks 552a, 552b. The mixing means operates as follows: While the supply of the plating solution 354 from the mixing tank 552a (or 552b) to the plating bath 402 is being stopped, the stop valve 562c connected to the mixing tank 552a (or 552b) is opened and the liquid delivery pump 572 connected thereto is operated to circulate the plating solution 354 in the mixing tank 552a (or 552b) through the branch pipe 578. In this manner, the solutions supplied to the mixing tank 552a (or 552b) are stirred and mixed uniformly into the plating solution 354 whose temperature has been uniformized.

The mixing tanks 552a, 552b have respective temperature sensors 652 (only one on the mixing tank 552a shown) for detecting the temperature of the plating solution. Output signals from the temperature sensors 652 are input to a controller 656, which produces an output signal to control the temperature regulators 570b.

If the system is to use an electroless Ni—B plating solution heated to and kept at a temperature of 70° C., then two solutions preheated to a temperature in the range from 50 to 60° C., for example, are supplied in given amounts to a selected one of the mixing tanks 552a, 552b. The supplied solutions are stirred and mixed into a plating solution 354, which is heated to and kept at a temperature of 70° C. by the temperature regulator 570b and supplied to the plating tank 402. Since the preheated solutions are mixed into the plating solution 354 in the mixing tanks 552a, 552b and the plating solution 354 is kept at the desired temperature by the temperature regulator 570b, even if the plating solution 354 is produced in a small amount, the temperature thereof is stabilized, and the plating solution 354 at the stable temperature can quickly be supplied to the plating tank 402. Each of the mixing tanks 552a, 552b may have a volume set to 2 liters, for example, so that a small amount of plating solution produced in the mixing tanks 552a, 552b can have its temperature stabilized.

The plating tank 402 has a temperature sensor 658 for detecting the temperature of the plating solution 354 in the plating tank 402. The temperature sensor 658 applies an output signal to a controller 656, which applies an output signal to control the temperature regulators 570b.

The plating solution retrieving system 360 has a three-way valve 560b positioned in the plating solution retrieval passage 452 downstream of the gas-liquid separator 454, for discharging the plating solution that has been made useless, and a three-way valve 560c positioned in the plating solution retrieval passage 452 downstream of the three-way valve 560b, for returning the used plating solution 354 to one of the mixing tanks 352a, 352b for reuse.

Operation of the above electroless plating unit for performing an electroless plating process will be described below.

The solution supplies 558 individually supply solutions to the solution supply tanks 550a, 550b, which hold predetermined amounts of supplied solutions. The solutions held in the solution supply tanks 550a, 550b are heated to and kept heated at a predetermined temperature ranging from 50 to 60° C., for example, by the respective temperature regulators 570a. Then, the mixing tank 52a, for example, is supplied with the solutions held in the solution supply tanks 550a, 550b. The stop valve 562b of the plating solution supply passage 574 connected to the mixing tank 552a is closed, and the stop valve 562c of the branch pipe 578 connected to the mixing tank 552a is opened. The liquid delivery pump 572 is actuated to stir the solutions supplied to the mixing tank 52a, and the temperature regulator 570b of the mixing tank 52a is operated to heat the solutions, which are mixed into a plating solution 354 at a predetermined temperature of 70° C., for example.

The substrate W is held by the substrate holder 350 and lifted to produce the plating bath 402 that is defined by the substrate W and the seal ring 386. The hot water 430, which is heated and kept at a predetermined temperature of 70° C., for example, is introduced from the hot water supply tank 434 into the heat-insulating tank 358 and circulated therebetween.

Based on a control signal from the controller 654, the stop valve 562b of the plating solution supply passage 574 connected to the mixing tank 552a is opened, and the stop valve 562c of the branch pipe 578 connected to the mixing tank 552a is closed. The liquid delivery pump 572 is actuated to supply a predetermined amount of the plating solution 354 produced in the mixing tank 552a to the plating tank 402 to plate the substrate W.

At this time, the temperature of the plating solution 354 in the mixing tank 552a is detected with the temperature sensor 152, and the temperature of the plating solution 354 in the processing bath 56 is detected with the temperature sensor 658. Output signals from these temperature sensors 652, 658 are input to the controller 656. The controller 656 determines the difference between the temperatures represented by the supplied output signals, i.e., a temperature drop that the plating solution 354 undergoes while it is being supplied from the mixing tank 552a to the plating tank 402, and then controls the temperature regulator 570c to compensate for the temperature drop (temperature difference), for thereby being supplied the plating solution 354 at a constant temperature to the plating tank 402 at all times.

The mixing tank 552b, as described above, is also supplied with predetermined amounts of solutions held in the solution supply tanks 550a, 550b and heated to a predetermined temperature. In the mixing tank 552b, a plating solution at a predetermined temperature of 70° C., for example, is produced and prepared by supplying solutions to the mixing tank 550b and mixed. The temperature regulator 570b is controlled to compensate for a temperature drop (temperature difference) that the plating solution 354 undergoes while it is being supplied from the mixing tank 552a to the plating tank 402.

When a desired number of substrates W have successively been processed with plating solution 354 in the mixing tank 552a, or the quality of the plating solution 354 detected with a sensor reaches to under the extent lever, the controller 654 produces an output signal to fully close the stop valve 562b of the plating solution supply passage 574 interconnecting the mixing tank 552a and the plating bath 402, and control the opening and closing of the stop valve 562b of the plating solution supply passage 574 interconnecting the mixing tank 552b and the plating bath 402. Now, the plating solution 354 supplied to the plating tank 402 is switched to the plating solution 354 in the mixing tank 552b prepared in advance. In this manner, the plating process is continued without interruptions in the supply of the plating solution 354 to the plating tank 402. Even when contaminants are introduced into the plating solution 354, e.g., an electroless plating solution that is generally unstable and easily decomposed, in one of the mixing tanks 552a, 552b and the plating solution 354 is contaminated by the introduced contaminants and can no longer be used as an effective processing liquid, it is only necessary to discard the contaminated plating solution 354 in the mixing tank. Therefore, the amount of the plating solution 354 to be discarded is much smaller than if the entire plating solution 354 in the system were to be discarded.

The above system can meet requirements for efficiently mixing a plurality of solutions into a plating solution immediately before the plating solution is used. The system allows as many substrates as can be processed to be plated simultaneously with a minimum amount of plating solution which is required, and hence can consume the plating solution at high efficiency.

Figure 20:
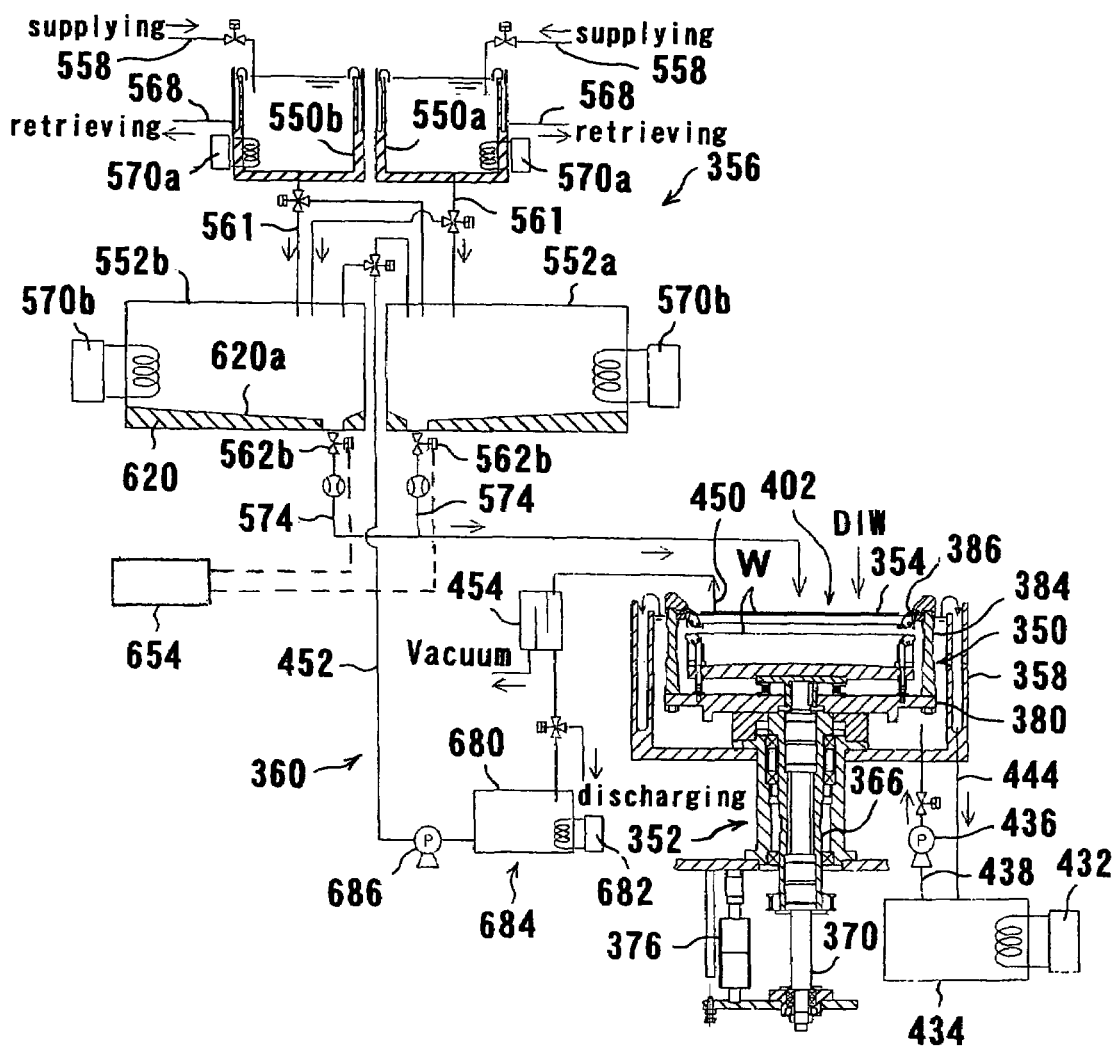
FIG. 20 is a schematic view of yet still another electroless plating section.

FIG. 20 schematically shows yet still another electroless plating section. In the electroless plating section shown in FIG. 20, the mixing tanks 552a, 552b are disposed above the plating bath 402. The plating solution 354 in the mixing tanks 552a, 552b is supplied by gravity to the plating bath 402 when the stop valves 562b of the plating liquid supply passages 574 are opened by a control signal from the controller 654. The plating solution retrieval passage 452 of the plating solution retrieving system 360 has an intermediate tank 680 for temporarily holding the retrieved plating solution 354 therein, and a temperature regulating device 684 with a temperature regulator 682 with a heater for heating the plating solution 354 in the intermediate tank 680 to a temperature of 70° C., for example, and keeping the plating solution 354 at that temperature. The plating solution retrieval passage 452 also has a liquid delivery pump 686 disposed downstream of the temperature regulating device 684.

Since the plating solution retrieving system 360 has the intermediate tank 680 and the temperature regulator 682 with the heater for heating the retrieved plating solution that is temporarily stored in the intermediate tank 680, when the retrieved plating solution is mixed with the plating solution in the mixing tanks 552a, 552b, the temperature of the plating solution in the mixing tanks 552a, 552b is prevented from being temporarily lowered.

Figure 21:
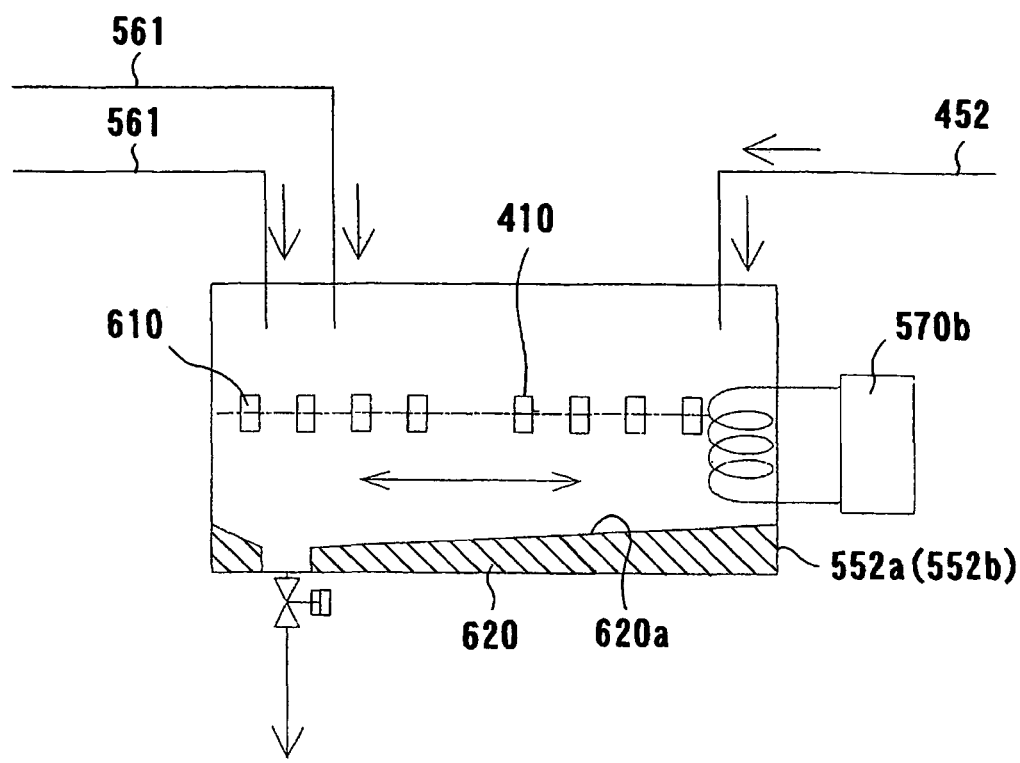
FIG. 21 is a schematic view of still another mixing tank.

The mixing tank 552a, 552b have a bottom wall 620 whose upper surface comprises a tapered surface 620a progressively lowered toward the draw portion of the bottom wall 620 to which the plating solution supply passages 574 is connected. The tapered surface 620a of the bottom wall 620 allows the plating solution 354 to be drawn efficiently from the mixing tank 552a, 552b into plating solution supply passages 574. Since the plating solution 354 is delivered by gravity to the plating bath 402, the plating solution supply passages 574 do not need any liquid delivery pumps. As shown in FIG. 21, a stirrer comprising reciprocally movable paddles 610 may be disposed in each of the mixing tank 552a, 552b.

According to the present invention, as described above, even when a small amount of processing liquid is supplied to and held in the processing head, inasmuch as the substrate holder which is holding the substrate is surrounded by the heat-insulating tank and the temperature of the substrate together with the substrate holder is managed by the thermal medium to keep the temperature of the processing liquid held in the processing head at a predetermined level, the processing liquid is prevented from changing while the substrate is being processed by the processing liquid. The amount of the processing liquid to be used is minimized by retrieving the processing liquid that has been used to process the substrate for reuse.

Although certain preferred embodiments of the present invention have been shown and described in detail, it should be understood that various changes and modifications may be made therein without departing from the scope of the appended claims.

What is claimed is:

1. An apparatus for processing a substrate, comprising:
a processing head for processing the substrate by bringing the substrate into contact with a processing liquid supplied to and held in the processing head, said processing head having a substrate holder for holding the substrate, said processing head being arranged to hold the substrate with said substrate holder while a surface to be processed of the substrate is facing upwardly, and to define a processing bath for holding the processing liquid with said surface to be processed of the substrate and a seal ring for sealing an outer peripheral region of said surface to be processed of the substrate;
a heat-insulating tank surrounding said substrate holder in a water-tight manner, for holding the processing liquid held in said processing head together with said substrate holder at a predetermined temperature with a thermal medium; and
a processing liquid supplying system for supplying the processing liquid at a predetermined temperature to said processing head.

2. An apparatus according to claim 1, further comprising:
a processing liquid retrieving system for retrieving the processing liquid which has been used to process the substrate from said processing head and returning the retrieved processing liquid to said processing liquid supplying system.

3. An apparatus according to claim 2, wherein said processing liquid retrieving system has a temperature regulating device for regulating the temperature of the processing liquid which is returned from said processing head to said processing liquid supplying system.

4. An apparatus according to claim 1, further comprising:
a hot water supply tank for holding a liquid as said thermal medium, said hot water supply tank having a temperature regulator, said heat-insulating tank and said hot water supply tank being connected to each other for circulating said thermal medium therebetween.

5. An apparatus according to claim 1, wherein said processing liquid supplying system has a processing liquid supply tank for holding the processing liquid therein, said processing liquid supply tank having a temperature regulator and a stirrer for stirring the processing liquid held therein.

6. An apparatus according to claim 1, wherein said processing liquid supplying system has a processing liquid supply tank for holding the processing liquid therein, and a temperature regulating device for regulating the temperature of the processing liquid which is supplied from said processing liquid supply tank to said processing head.

7. An apparatus according to claim 1, wherein said processing liquid comprises an electroless plating solution.

8. An apparatus for processing a substrate, comprising:
a processing head for processing the substrate by bringing the substrate into contact with a processing liquid supplied to and held in the processing head, said processing head having a substrate holder for holding the substrate;
a heat-insulating tank surrounding said substrate holder in a water-tight manner, for holding the processing liquid held in said processing head together with said substrate holder at a predetermined temperature with a thermal medium;
a processing liquid supplying system for supplying the processing liquid at a predetermined temperature to said processing head; and
a heating head for contacting the processing liquid held in said processing head, thereby to heat the processing liquid, wherein said heating head has a contact surface for contacting said processing liquid held in said processing head, said contact surface being tapered such that the distance between said contact surface and the surface of the processing liquid held in said processing head is progressively increased radially outwardly from the center of the contact surface.

9. An apparatus for processing a substrate, comprising:

a processing head for processing the substrate by bringing the substrate into contact with a processing liquid supplied to and held in the processing head, said processing head having a substrate holder for holding the substrate;

a heat-insulating tank surrounding said substrate holder in a water-tight manner, for holding the processing liquid held in said processing head together with said substrate holder at a predetermined temperature with a thermal medium; and a processing liquid supplying system for supplying the processing liquid at a predetermined temperature to said processing head, wherein said processing liquid supplying system has a plurality of solution supply tanks for individually holding a plurality of solutions, respectively, to be mixed into a processing liquid, said solution supply tanks having respective temperature regulators, and a plurality of mixing tanks connected to said solution supply tanks for mixing the solutions supplied respectively from said solution supply tanks into the processing liquid, said mixing tanks having respective temperature regulators.

10. An apparatus for processing a substrate, comprising:

a processing head for processing the substrate by bringing the substrate into contact with a processing liquid supplied to and held in the processing head, said processing head having a substrate holder for holding the substrate;

a heat-insulating tank surrounding said substrate holder in a water-tight manner, for holding the processing liquid held in said processing head together with said substrate holder at a predetermined temperature with a thermal medium; and a processing liquid supplying system for supplying the processing liquid at a predetermined temperature to said processing head, wherein said processing liquid supplying system has a plurality of solution supply tanks for individually holding a plurality of solutions, respectively, to be mixed into a processing liquid, and a plurality of mixing tanks connected to said solution supply tanks for mixing the solutions supplied respectively from said solution supply tanks into the processing liquid.

* * * * *